United States Patent
An et al.

(10) Patent No.: US 12,298,454 B2
(45) Date of Patent: May 13, 2025

(54) APPARATUS AND METHOD FOR PET DETECTOR

(71) Applicant: SHANGHAI UNITED IMAGING HEALTHCARE CO., LTD., Shanghai (CN)

(72) Inventors: Shaohui An, Shanghai (CN); Qiang Zhang, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 377 days.

(21) Appl. No.: 17/813,015

(22) Filed: Jul. 15, 2022

(65) Prior Publication Data
US 2022/0357471 A1    Nov. 10, 2022

Related U.S. Application Data

(63) Continuation-in-part of application No. 17/804,597, filed on May 30, 2022, now Pat. No. 11,782,175, (Continued)

(51) Int. Cl.
*G01T 1/29* (2006.01)
*G01T 1/164* (2006.01)
(Continued)

(52) U.S. Cl.
CPC .......... *G01T 1/2985* (2013.01); *G01T 1/1644* (2013.01); *G01T 1/2018* (2013.01); *H01L 27/14663* (2013.01)

(58) Field of Classification Search
CPC ... G01T 1/2985; G01T 1/1644; G01T 1/2018; H01L 27/14663
See application file for complete search history.

(56) References Cited

U.S. PATENT DOCUMENTS 5,319,204 A    6/1994   Wong
5,451,789 A    9/1995   Wong et al.
(Continued)

FOREIGN PATENT DOCUMENTS

CN    101071705 A    11/2007
CN    101561506 A    10/2009
(Continued)

OTHER PUBLICATIONS

Seong Jong Hong et al., An Investigation into the Use of Geiger-mode Solid-state Photomultipliers for Simultaneous PET and MRI Acquisition, IEEE Transactions on Nuclear Science, 55(3): 882-888, 2008.
(Continued)

*Primary Examiner* — Dani Fox
*Assistant Examiner* — Fani Polyzos Boosalis
(74) *Attorney, Agent, or Firm* — METIS IP LLC

(57) ABSTRACT

A PET detector and method thereof are provided. The PET detector may include: a crystal array including a plurality of crystal elements arranged in an array and light-splitting structures set on surfaces of the plurality of crystal elements, the light-splitting structures jointly define a light output surface of the crystal array; a semiconductor sensor array, which is set in opposite to the light output surface of the crystal array and is suitable to receive photons from the light output surface, the semiconductor sensor array comprises a plurality of semiconductor sensors arranged in an array.

20 Claims, 14 Drawing Sheets

Related U.S. Application Data which is a continuation of application No. 17/134,554, filed on Dec. 28, 2020, now Pat. No. 11,378,702, which is a continuation of application No. 16/256,178, filed on Jan. 24, 2019, now Pat. No. 10,877,169, which is a continuation of application No. 15/809,708, filed on Nov. 10, 2017, now abandoned, which is a continuation of application No. 15/454,756, filed on Mar. 9, 2017, now Pat. No. 9,835,740, which is a continuation of application No. 14/822,892, filed on Aug. 10, 2015, now Pat. No. 9,696,439.

(51) Int. Cl.
    *G01T 1/20*         (2006.01)
    *H01L 27/146*       (2006.01)

(56) References Cited

U.S. PATENT DOCUMENTS

| | | |
|---|---|---|
| 5,453,623 A | 9/1995 | Wong et al. |
| 5,504,386 A | 4/1996 | Kyushima et al. |
| 5,825,031 A | 10/1998 | Wong et al. |
| 5,866,908 A | 2/1999 | Novak |
| 6,114,703 A | 9/2000 | Levin et al. |
| 6,222,192 B1 | 4/2001 | Sekela et al. |
| 6,245,184 B1 | 6/2001 | Riedner et al. |
| 6,287,128 B1 | 9/2001 | Jones et al. |
| 6,310,349 B1 | 10/2001 | Wong et al. |
| 6,407,392 B1 | 6/2002 | Tsuyuki et al. |
| 6,744,053 B2 | 6/2004 | Wong et al. |
| 6,749,761 B1 | 6/2004 | Andreaco et al. |
| 6,936,822 B2 | 8/2005 | Wong et al. |
| 6,956,214 B2 | 10/2005 | Wong et al. |
| 7,071,474 B2 | 7/2006 | Wong et al. |
| 7,157,014 B1 | 1/2007 | Andreaco et al. |
| 7,180,074 B1 | 2/2007 | Crosetto |
| 7,193,208 B1 | 3/2007 | Burr et al. |
| 7,238,943 B2 | 7/2007 | Wong et al. |
| 7,385,201 B1 | 6/2008 | Joung et al. |
| 7,388,209 B1 | 6/2008 | Gormley et al. |
| 7,405,404 B1 | 7/2008 | Shah |
| 7,638,760 B1 | 12/2009 | Heipp et al. |
| 8,258,480 B2 | 9/2012 | Olcott et al. |
| 9,575,192 B1 | 2/2017 | Ng et al. |
| 9,835,740 B2 | 12/2017 | An et al. |
| 9,929,199 B2 | 3/2018 | Igarashi et al. |
| 2003/0218120 A1 | 11/2003 | Shibayama |
| 2003/0226972 A1 | 12/2003 | Wong et al. |
| 2004/0021082 A1 | 2/2004 | Wong et al. |
| 2004/0026624 A1 | 2/2004 | Wainer et al. |
| 2004/0054248 A1 | 3/2004 | Kimchy et al. |
| 2004/0108471 A1 | 6/2004 | Luo et al. |
| 2004/0124360 A1 | 7/2004 | Levin |
| 2004/0124361 A1 | 7/2004 | Yamakawa |
| 2004/0129886 A1 | 7/2004 | Lecoq |
| 2004/0173750 A1 | 9/2004 | Welsh et al. |
| 2004/0188624 A1 | 9/2004 | Wong et al. |
| 2004/0195512 A1 | 10/2004 | Crosetto |
| 2004/0217292 A1 | 11/2004 | Moyers et al. |
| 2005/0067578 A1 | 3/2005 | Ueno et al. |
| 2005/0072914 A1 | 4/2005 | Chapman |
| 2005/0087693 A1 | 4/2005 | Sumiya et al. |
| 2005/0113667 A1 | 5/2005 | Schlyer et al. |
| 2005/0139777 A1 | 6/2005 | Rostaing et al. |
| 2005/0167599 A1 | 8/2005 | Schlyer et al. |
| 2005/0178971 A1 | 8/2005 | Hoge |
| 2005/0199817 A1 | 9/2005 | Aoki |
| 2005/0211906 A1 | 9/2005 | Tonami et al. |
| 2005/0230630 A1 | 10/2005 | Yanagita et al. |
| 2005/0247879 A1 | 11/2005 | Xie et al. |
| 2005/0253076 A1 | 11/2005 | Wollenweber et al. |
| 2005/0285042 A1 | 12/2005 | Joung |
| 2006/0000979 A1 | 1/2006 | Xie et al. |
| 2006/0065826 A1 | 3/2006 | Wang et al. |
| 2006/0067466 A1 | 3/2006 | Hawman |
| 2006/0076497 A1 | 4/2006 | Yamada et al. |
| 2006/0076519 A1 | 4/2006 | Hawman et al. |
| 2006/0081786 A1 | 4/2006 | Berthold et al. |
| 2006/0138315 A1 | 6/2006 | Williams et al. |
| 2006/0145081 A1 | 7/2006 | Hawman |
| 2006/0151705 A1 | 7/2006 | Manjeshwar |
| 2006/0151707 A1 | 7/2006 | Wellnitz et al. |
| 2006/0186341 A1 | 8/2006 | Ueno et al. |
| 2006/0197022 A1 | 9/2006 | Burr et al. |
| 2006/0197025 A1 | 9/2006 | Burr et al. |
| 2006/0202125 A1 | 9/2006 | Suhami |
| 2006/0261279 A1 | 11/2006 | Crosetto |
| 2006/0266947 A1 | 11/2006 | Krieg et al. |
| 2006/0284096 A1 | 12/2006 | Krieg et al. |
| 2006/0284122 A1 | 12/2006 | Caldwell |
| 2007/0001121 A1 | 1/2007 | Gally et al. |
| 2007/0025522 A1 | 2/2007 | Fenster et al. |
| 2007/0029491 A1 | 2/2007 | Olden et al. |
| 2007/0030141 A1 | 2/2007 | Manneschi et al. |
| 2007/0040126 A1 | 2/2007 | El-Hanany et al. |
| 2007/0061099 A1 | 3/2007 | Turner et al. |
| 2007/0069136 A1 | 3/2007 | Hawman |
| 2007/0069138 A1 | 3/2007 | Wang |
| 2007/0080295 A1 | 4/2007 | Hamill |
| 2007/0096027 A1 | 5/2007 | McParland |
| 2007/0117439 A1 | 5/2007 | Yokoi et al. |
| 2007/0176110 A1 | 8/2007 | Yokoi et al. |
| 2007/0194242 A1 | 8/2007 | Fiedler et al. |
| 2007/0262260 A1 | 11/2007 | Shah |
| 2007/0278414 A1 | 12/2007 | Yokoi et al. |
| 2007/0290137 A1 | 12/2007 | Tonami et al. |
| 2008/0007173 A1 | 1/2008 | Yamaguchi et al. |
| 2008/0033279 A1 | 2/2008 | Ladebeck et al. |
| 2008/0042070 A1 | 2/2008 | Levin |
| 2008/0099685 A1 | 5/2008 | Karp et al. |
| 2008/0116383 A1 | 5/2008 | Joung et al. |
| 2008/0135770 A1 | 6/2008 | Arseneau |
| 2008/0283760 A1 | 11/2008 | Tsuchiya et al. |
| 2008/0317320 A1 | 12/2008 | Van Stevendaal et al. |
| 2009/0032714 A1 | 2/2009 | Peter et al. |
| 2009/0173885 A1 | 7/2009 | Zeitler et al. |
| 2009/0194701 A1 | 8/2009 | Seino et al. |
| 2009/0230285 A1 | 9/2009 | Wright |
| 2009/0259728 A1 | 10/2009 | Berisford et al. |
| 2009/0310735 A1 | 12/2009 | Tonami |
| 2010/0010343 A1 | 1/2010 | Daghighian et al. |
| 2010/0012846 A1 | 1/2010 | Wang |
| 2010/0025587 A1 | 2/2010 | Benlloch Baviera et al. |
| 2010/0074396 A1 | 3/2010 | Schmand et al. |
| 2010/0098311 A1 | 4/2010 | Thon et al. |
| 2010/0108896 A1 | 5/2010 | Surti et al. |
| 2010/0116999 A1 | 5/2010 | Tümer et al. |
| 2010/0134335 A1 | 6/2010 | Park et al. |
| 2010/0148074 A1 | 6/2010 | Menge et al. |
| 2010/0155610 A1 | 6/2010 | Menge et al. |
| 2010/0163738 A1 | 7/2010 | Danzer et al. |
| 2010/0176301 A1 | 7/2010 | Wieczorek et al. |
| 2010/0252723 A1 | 10/2010 | Frach et al. |
| 2010/0270462 A1 | 10/2010 | Nelson et al. |
| 2011/0227621 A1 | 9/2011 | Ridgers |
| 2011/0253901 A1 | 10/2011 | Chmeissani Raad et al. |
| 2011/0315855 A1 | 12/2011 | Perlman et al. |
| 2012/0006992 A1 | 1/2012 | Yanada et al. |
| 2012/0012751 A1 | 1/2012 | Saenger |
| 2012/0104259 A1 | 5/2012 | Mann |
| 2013/0066589 A1 | 3/2013 | Ye et al. |
| 2013/0082264 A1 | 4/2013 | Couture et al. |
| 2013/0153776 A1 | 6/2013 | Wieczorek et al. |
| 2013/0161521 A1 | 6/2013 | Rose et al. |
| 2013/0264464 A1 | 10/2013 | Heifets et al. |
| 2013/0275054 A1 | 10/2013 | Simpson et al. |
| 2013/0307713 A1 | 11/2013 | Kawaguchi et al. |
| 2013/0313437 A1 | 11/2013 | Li et al. |
| 2014/0138548 A1 | 5/2014 | Li et al. |
| 2015/0028218 A1 | 1/2015 | Kataoka et al. |
| 2015/0119694 A1 | 4/2015 | Mihlin et al. |

(56) References Cited

U.S. PATENT DOCUMENTS

| | | |
|---|---|---|
| 2015/0177390 A1 | 6/2015 | Mattson et al. |
| 2017/0176610 A1 | 6/2017 | An et al. |
| 2024/0310535 A1* | 9/2024 | Oike .................. G01T 1/202 |

FOREIGN PATENT DOCUMENTS

| CN | 101561508 A | 10/2009 |
|---|---|---|
| CN | 101806912 A | 8/2010 |
| CN | 101833106 A | 9/2010 |
| CN | 101839991 A | 9/2010 |
| CN | 102073058 A | 5/2011 |
| CN | 102129082 A | 7/2011 |
| CN | 102331599 A | 1/2012 |
| CN | 102565841 A | 7/2012 |
| CN | 102783961 A | 11/2012 |
| CN | 103158203 A | 6/2013 |
| CN | 203062650 U | 7/2013 |
| CN | 203149126 U | 8/2013 |
| CN | 103376458 A | 10/2013 |
| CN | 103376459 A | 10/2013 |
| CN | 103567685 A | 2/2014 |
| CN | 103592671 A | 2/2014 |
| CN | 103668465 A | 3/2014 |
| CN | 104184473 A | 12/2014 |
| CN | 104414671 A | 3/2015 |
| CN | 104434160 A | 3/2015 |
| CN | 104795304 A | 7/2015 |
| CN | 105425270 A | 3/2016 |
| CN | 108888286 A | 11/2018 |
| JP | H06150877 A | 5/1994 |
| JP | 2000098040 A | 4/2000 |
| JP | 2005087366 A | 4/2005 |
| JP | 2008145335 A | 6/2008 |
| JP | 2008263190 A | 10/2008 |
| WO | 0017670 A1 | 3/2000 |
| WO | WO-2011056660 A2 * | 5/2011 ............. A61B 6/037 |

OTHER PUBLICATIONS

Sun Il Kwon et al., Development of Small-Animal PET Prototype Using Silicon Photomultiplier (SiPM): Initial Results of Phantom and Animal Imaging Studies, The Journal of Nuclear Medicine, 52(4): 572-579, 2011.

Wang, Dong et al., Influence of Scintillator Shape and Film Reflector on Detector Efficiency, Nuclear Techniques, 34(12): 905-908, 2011.

Craig S. Levin, Design of a High-Resolution and High-Sensitivity Scintillation Crystal Array for PET With Nearly Complete Light Collection, IEEE Transactions on Nuclear Science, 49(5): 2236-2243, 2002.

Case 1:18-cv-00841-UNA considered by applicant, Jun. 4, 2018, pp. 4 to 9.

Instructions for Small Crystal, Big Impact, 2017, 1 page.

Biograph mMR product brochure dated in Nov. 2011, 16 pages, www.healthcare.siemens.com.

Harald H. Quick et al., Whole-Body MR/PET Hybrid Imaging: Technical Considerations, Clinical Workflow, and Initial Results, MReadings: molecular MRI, Jan. 2011, pp. 14-26, www.siemens.com/magnetom-world.

First Office Action in Chinese Application No. 201810245033.0 mailed on May 17, 2021, 19 pages.

* cited by examiner

APPARATUS AND METHOD FOR PET DETECTOR

CROSS-REFERENCE TO RELATED APPLICATIONS

The application is a Continuation-in-part of U.S. application Ser. No. 17/804,597, filed on May 30, 2022, which is a Continuation of U.S. application Ser. No. 17/134,554, filed on Dec. 28, 2020, now U.S. Pat. No. 11,378,702, which is a Continuation of U.S. application Ser. No. 16/256,178, filed on Jan. 24, 2019, now U.S. Pat. No. 10,877,169, which is a Continuation of U.S. application Ser. No. 15/809,708, filed on Nov. 10, 2017, which is a Continuation of U.S. application Ser. No. 15/454,756, filed on Mar. 9, 2017, now U.S. Pat. No. 9,835,740, which is a Continuation of U.S. application Ser. No. 14/822,892, filed on Aug. 10, 2015, now U.S. Pat. No. 9,696,439, the contents of each of which are hereby incorporated by reference.

TECHNICAL FIELD

The present disclosure relates to the technical field of optical detecting, to be more specific, to an apparatus and a method for a PET detector.

BACKGROUND

Generally, positron emission tomography (PET) detectors have been set in various large medical devices such as, positron emission tomography-computed tomography (PET-CT) devices, positron emission tomography-magnetic resonance imaging (PET-MRI) devices, in which PET technologies are applied. PET detectors are used to receive γ rays generated from a patient's body and to provide information related to the locations where photons are excited by γ rays in the sensors to other components of the large medical devices, so that the other components of the large medical devices may process appropriately based on the location information.

As shown in FIG. 1, currently, a PET detector typically includes a crystal array 102, an avalanche photo diode (APD) array 104 coupled with the crystal array 102, and a light guide 106 which is set between the crystal array 102 and the APD array 104. Among them, the crystal array 102 is formed by multiple crystal elements, which are arranged according to a certain design. The APD array 104 is formed by multiple APDs, which are arranged according to a certain design. Each APD contacts with at least one crystal element.

The γ rays generated in the patient's body are received by a certain crystal element in the crystal array 102. The γ rays excite photons inside the crystal element. The photons transmit among several crystal elements in the crystal array 102, and ultimately enter into the APD array 104 through the light guide 106. And then they are received by the APD array.

When the γ rays excite photons inside the crystal element, optical transmission loss may be caused by the light guide 106. As such, only a portion of the excited photons may enter into the APD array 104, resulting in a lower resolution of the PET detector.

SUMMARY

The embodiments of the present invention is intended to solve the problem to enhance the resolution of a PET detector.

To solve the problem, according to embodiments of the present invention a PET detector is provided, which comprises:

a crystal array, which comprises a plurality of crystal elements and a light splitting structure on a surface of each of the plurality of crystal elements, the light splitting structures defining a light output surface of the crystal array jointly;

a semiconductor sensor array comprising a plurality of semiconductor sensors for receiving photons from the light output surface, each of the plurality of semiconductor sensors contacting at least a portion of the light output surface of the crystal array.

In some embodiments, more than one of the plurality of crystal elements in the crystal array may be coupled with one semiconductor sensor of the semiconductor sensor array.

In some embodiments, at least one semiconductor sensor of the semiconductor sensor array may be coupled with each of the plurality of crystal elements in the crystal array.

In some embodiments, the coupling comprises a contact between the semiconductor sensors and the crystal elements directly or through an adhesive material.

In some embodiments, a center-of-gravity of the semiconductor sensor array may coincide with a center-of-gravity of the crystal array.

In some embodiments, the semiconductor sensor array may completely or partially cover the light output surface.

In some embodiments, the light-splitting structure may include a light-reflective membrane or a white light-reflective coating.

In some embodiments, the PET detector further comprises a first amplifier, an input terminal of the first amplifier being connected with an output terminal of a semiconductor sensor in a predetermined row of the semiconductor sensor array.

In some embodiments, the PET detector further comprises a second amplifier, an output terminal of the first amplifier being connected with an output terminal of a semiconductor sensor in a predetermined column of the semiconductor sensor array.

In some embodiments, the light-splitting structures on the surfaces of the crystal elements may be set based on light-receiving areas of the semiconductor sensors, a relative positioning between the semiconductor sensors, relative positioning between the semiconductor sensors and the crystal array.

In some embodiments, a resolution of the crystal elements in an image may relate to a number or positioning of the semiconductor sensors.

According to embodiments of the present invention, a method for setting a PET detector is further provided, which comprises:

adjusting an area of a light-splitting structure on each of a plurality of crystal elements in a crystal array, the light-splitting structures jointly forming a light output surface of the crystal array; and setting the semiconductor sensor array in contact with at least a portion of the light output surface of the crystal array.

In some embodiments, the adjusting areas of light-splitting structures set on each crystal element in the crystal array comprises:

adjusting a probability of photon occurrence in a crystal element;

if the probability of photon occurrence in the crystal element satisfies a resolution condition, setting the area of the crystal element according to the area of the light-splitting structure corresponding to the probability of photon occurrence.

In some embodiments, the adjusting of the probability of photon occurrence in the crystal element comprises:

adjusting the probability of photon occurrence in a first crystal element according to the following equation:

$$P(m) = \frac{N!}{m!(N-m)!} p^m (1-p)^{(N-m)}$$

wherein N represents a total number of the photons excited in a second crystal element in the crystal array other than the first crystal element, m represents a number of the photons excited in the first crystal element when N photons are excited in the second crystal element, p represents a probability that when a photon is excited in the second crystal element the photon occurs in the first crystal element, and P represents a probability that m photons occur in the first crystal element when N photons are excited in the second crystal element.

According to embodiments of the present invention, a detection method is further provided, which comprises:

providing a PET detector;

receiving a γ ray by a crystal element of the PET detector;

receiving photons excited by the γ ray in the crystal element by a semiconductor sensor of the PET detector;

determining a position where the γ ray generates the photons in the crystal element according to an output of the semiconductor sensor.

In some embodiments, the determining of the position comprises using a center-of-gravity readout method.

In some embodiments, a positron emission tomography (PET) detector is provided. The PET detector may include:

a crystal array, the crystal array comprising a plurality of crystal elements; each of the plurality of crystal elements extending along up-to-down direction, and having an upper side and a lower side, and a surrounding surface between the upper side and the lower side;

a light-splitting structure on the surface of each of the plurality of crystal elements, the light-splitting structure corporately with the crystal array to define a light output surface; and a semiconductor sensor array comprising a plurality of semiconductor sensors for receiving photons from the light output surface, each of the plurality of semiconductor sensors sharing at least a portion of the light output surface of the crystal array.

Embodiments of the present invention may have the following features:

By setting light-splitting structures on the crystal elements, the transmission distance of photons may be effectively shorten, compared to that of photons in the case of setting light guide between the crystal array and semiconductor sensors, therefore light transmission loss may be avoided, and the resolution of the PET detector may be enhanced.

By coupling a portion of crystal elements in the crystal array with the corresponding semiconductor sensors in the semiconductor sensor array, there is no need to couple every crystal element in the crystal array with its corresponding semiconductor sensor, which makes the setting of the number of semiconductor sensors more flexible. Therefore, when the same number of crystal elements are used, less semiconductor sensors may be used to satisfy the same resolution of crystal elements in the same image. Thus the cost of the PET detector may be reduced.

By setting the center-of-gravity of the semiconductor sensor array in coincidence with the center-of-gravity of the crystal array, the use of the center-of-gravity readout method to determine the location where photons are excited may be more convenient.

As the semiconductor sensor array may cover the light output surface completely or partially, the setting of the number and positions of sensors may be more flexible, therefore, when the same number of crystal elements is used, less semiconductor sensors may be used to satisfy the same resolution of crystal elements in the same image. Thus the cost of the PET detector may be reduced.

By setting the first amplifier and the second amplifier, when the center-of-gravity readout method is used to determine the location where photons are excited, the location where photons are excited may be determined directly according to the output of the first amplifier and the second amplifier, and it is not required to read every output of semiconductor sensors. Therefore, the amount of data processed to determine the location where photons are excited, and the difficulty to determine the locations of photons may be reduced.

By adjusting the probability of photon occurrence in the whole crystal element according to the equation $$P(m) = \frac{N!}{m!(N-m)!} p^m (1-p)^{(N-m)}$$

and adjusting the area of a light-splitting structure on a corresponding crystal element, a desired spatial resolution of images may be satisfied more rapidly.

DETAILED DESCRIPTION

Figure 1:
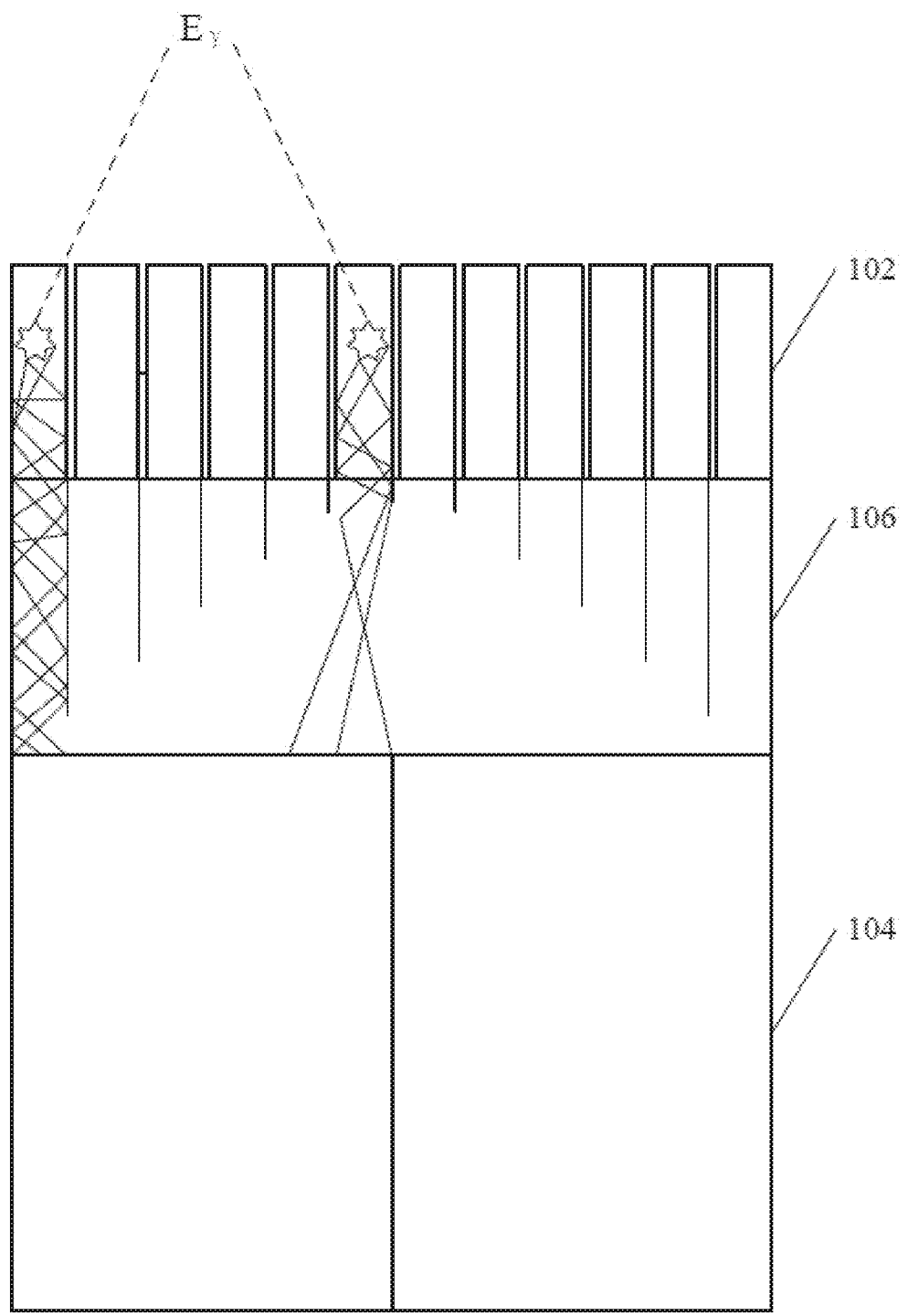
FIG. 1 is a diagram illustrating a longitudinal section of a PET detector in related art.

In a PET detector structure as shown in FIG. 1, after a γ ray generates photons in a crystal element, the photons may enter an APD array 104 through a light guide 106. The arrangement of the light guide 106 may increase the distance of the photon transmission, and may cause some loss in optical transmission and a decrease in the PET detector resolution.

The above-mentioned features of the present disclosure will become further apparent from the following detailed description of the specific embodiment of the present invention with reference to the accompanying drawings.

Figure 2:
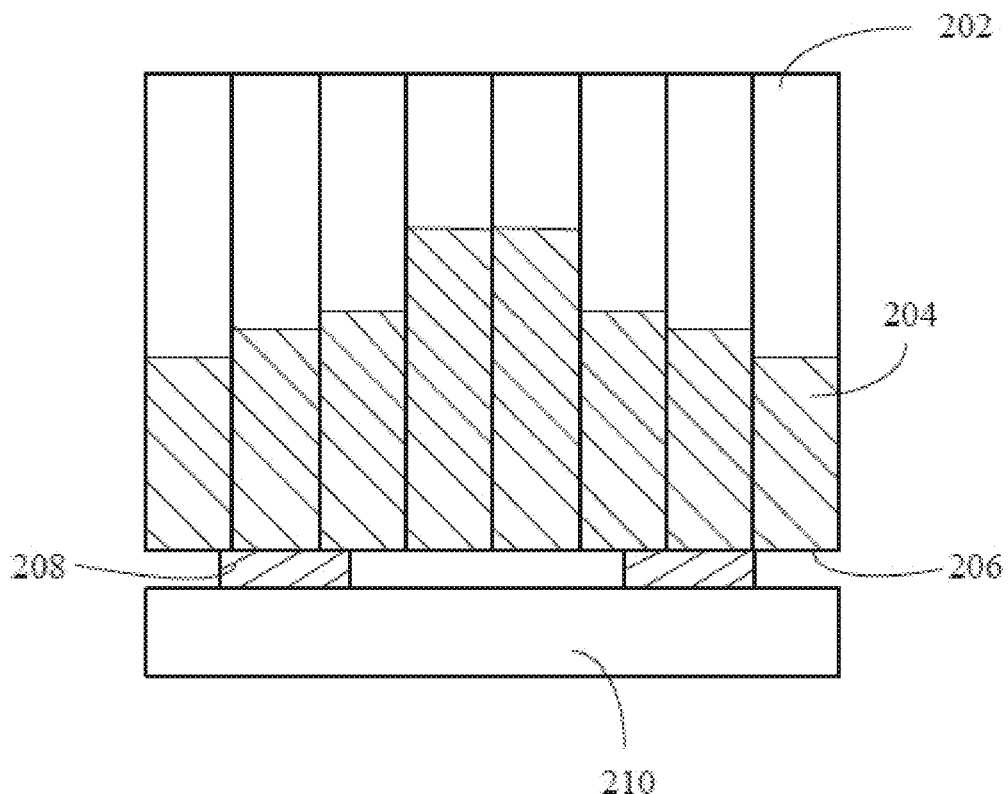
FIG. 2 is a diagram illustrating a longitudinal section of a PET detector according to one embodiment of the present disclosure.

FIG. 2 illustrates an exemplary PET detector according to some embodiments of the present disclosure. As illustrated, the PET detector may include a crystal array and a semiconductor sensor array. Merely for convenience of illustration, FIG. 2 shows a crystal array and a semiconductor sensor array. In some embodiments, the PET detector may include a plurality of crystal arrays and a plurality of semiconductor sensor arrays.

The crystal array may include multiple crystal elements 202 arranged in an array, and optionally a light-splitting structure 204 that is coupled to the surface of the crystal elements 202. The light-splitting structures 204 on the multiple crystal elements 202 may define a light output surface 206 of the crystal array. The semiconductor sensor array may be mounted in opposite to the light output surface 206 of the crystal array. The semiconductor sensor array may comprise multiple semiconductor sensors 208 arranged in an array. The semiconductor sensor array is integrated on the driver board 210. The driver board 210 is connected to the semiconductor sensor 208, applicable to drive the operation of the corresponding semiconductor sensor.

Each of the crystal elements 202 may correspond to a light output surface. A light output surface of a given crystal element 202 may refer to a surface of the given crystal element through which a photon exits the given crystal element to enter corresponding a semiconductor sensor 208 corresponding to the given crystal element. In some embodiments of the present disclosure, the light output surfaces 206 may include the light output surfaces of crystal elements 202.

Figure 3:
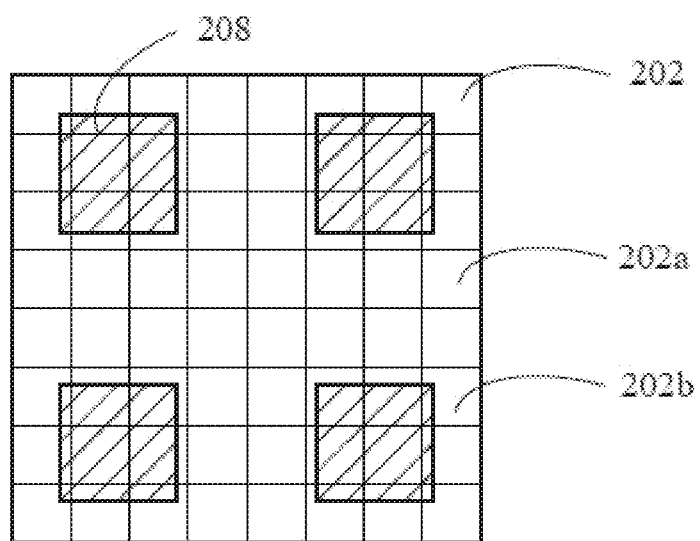
FIGS. 3-7 are diagrams illustrating examples of a cross section of a PET detector in accordance with some embodiments of the present disclosure.
Figure 4:
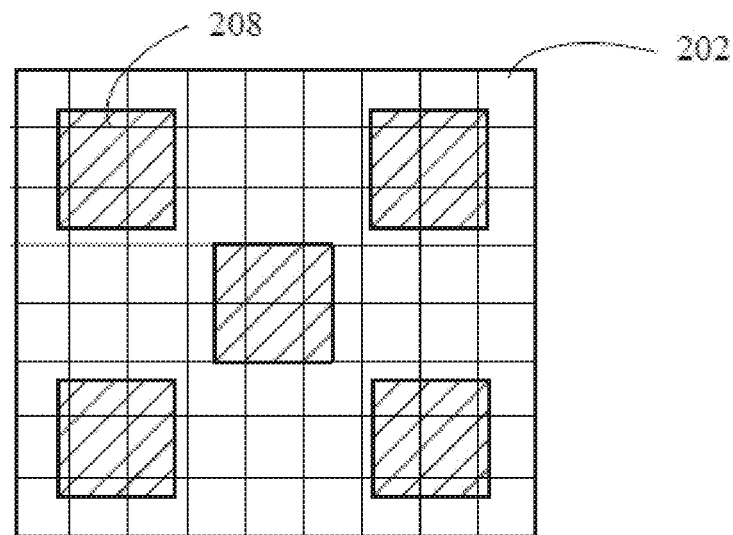
Figure 5:
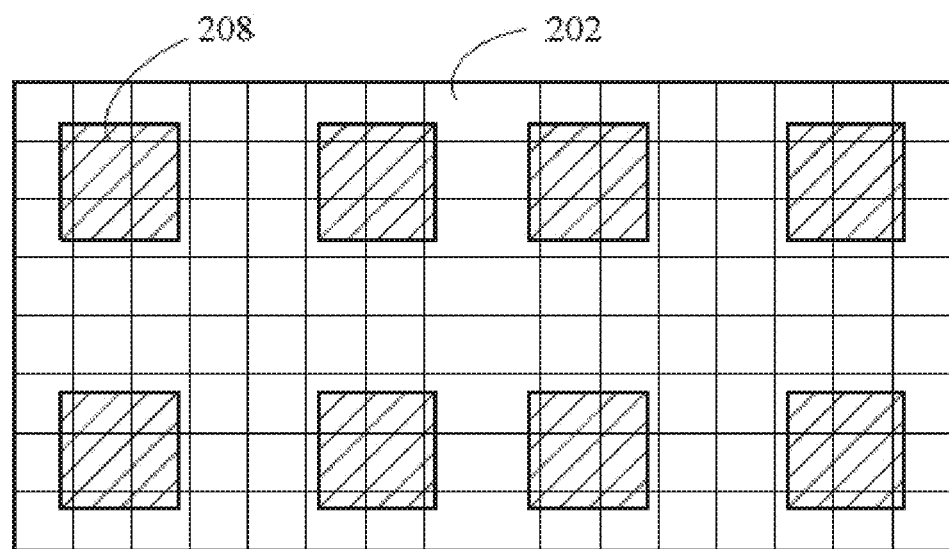

The crystal array may include any suitable number of crystal elements 202. The crystal elements 202 may be arranged in any suitable manner. As an example, the crystal array comprises three or more crystal elements 202. As another example, as shown in FIGS. 3-5, the crystal elements 202 may be arranged in an 8×8 array, an 8×9 array, an 8×19 array, etc. In some embodiments, the number of crystal elements 202 in the crystal array may be determined based on the dimensions of the PET detector 200. For example, a larger PET detector may include a greater number of crystal elements 202. Various numbers of crystal elements may correspond to various sizes of PET detectors.

Each crystal element 202 may be made of various materials, such as one or more of bismuth germanium oxide, lutetium oxyorthosilicate, lutetium yttrium oxyorthosilicate, lutetium gadolinium oxyorthosilicate, gadolinium orthosilicate, yttrium orthosilicate, barium fluoride, sodium iodide, cesium iodide, lead tungstate, yttrium aluminum perovskite, lanthanum (III) bromide, lanthanum (III) chloride, lutetium aluminum perovskite, lutetium pyrosilicate, lutetium aluminate and lutetium iodide, etc.

A γ ray may excite one or more photons in the crystal array. For example, the γ ray may excite multiple photons in a crystal element 202 (also referred to herein as the "first crystal element"). One or more of the excited photons may travel towards a light-splitting structure 204 coupled to the first crystal element. Upon receiving one or more of the excited photons, the light-splitting structure 204 may change the path of the received photons. For example, the received photons may be reflected by the light-splitting structure and may then enter a semiconductor sensor corresponding to the first crystal element through a surface of the first crystal element (e.g., the light output surface of the crystal element 202 that may be used to define light output surface 208). In some embodiments, one or more of the photons excited in the first crystal element may enter into a semiconductor sensor corresponding to another crystal element in the crystal array (also referred to herein as the "second crystal element") through a surface of second crystal element (e.g., a light output surface of the second crystal element that may be used to define the light output surface 206). In some embodiments, the semiconductor sensor corresponding to the first crystal element and the semiconductor sensor corresponding to the second crystal element may or may not be the same. In some embodiments, a particular semiconductor sensor of the semiconductor sensor array may receive photons from a surface of a crystal element used to define the light output surface, or from respective surfaces of multiple crystal elements used to define the light output surface.

In some embodiments, as the semiconductor sensors array receive photons from the light output surface of the crystal array, the semiconductor sensors may be coupled to the crystal elements in any suitable manner. For example, the semiconductor sensors may contact with the crystal elements through one or more adhesive materials. Examples of the adhesive material include silicone grease and/or any other suitable material that may be used to couple a crystal element and a semiconductor sensor.

As another example, a portion of the crystal elements of the crystal array may be coupled to one or more semiconductor sensors 208 of the semiconductor sensor array, which allows the semiconductor sensors to receive photons from the light output surface of the crystal array. Wherein the portion of crystal elements of the crystal array may correspond to one or more semiconductor sensors.

FIG. 3 is a schematic diagram of a cross section of a PET detector in accordance with some embodiments of the disclosure. In some embodiments, the PET detector of FIG. 3 may be the PET detector as described above in connection with FIG. 2. The crystal elements and the semiconductor sensors of FIG. 3 may be the same as one or more of the crystal elements 202 and the semiconductor sensors 206 of FIG. 1, respectively.

As illustrated, the crystal array of the PET detector may be and/or include an 8×8 array of crystal elements 202. The semiconductor sensor array may be and/or include a 2×2 array of semiconductor sensors. The crystal elements 202 may include one or more crystal elements 202a that are coupled to one or more semiconductor sensor 208. The crystal elements may also include one or more crystal elements 202b that are not coupled to a semiconductor sensor 208. In some embodiments, a portion of the crystal array (e.g., one or more crystal elements 202a) may correspond to (e.g., be coupled to) a semiconductor sensor 208. For example, as shown in FIG. 3, four portions of the crystal array may correspond to four semiconductor sensors 208 of the semiconductor sensor array, respectively. In some embodiments, after the γ ray excites photons within a crystal element 202b that is not coupled to a semiconductor sensor 208, the photons may be transmitted into one or more crystal elements 202a (e.g., crystal elements that are covered by one or more semiconductor sensors 208) via the light-splitting structure coupled to a surface of the crystal element 202b. A semiconductor sensor corresponding to the crystal element 202a may then receive the photons.

According to another embodiment of the present disclosure, at least one semiconductor sensor of the semiconductor sensors array is coupled to the corresponding crystal elements of the crystal array, such that the semiconductor sensors may receive photons from the light output surface of the crystal array. Wherein within the semiconductor array, one or more semiconductors may have corresponding crystal elements within the crystal array, so long as one semiconductor sensor of the semiconductor sensors array may receive photons from the light output surface of the crystal array.

Figure 6:
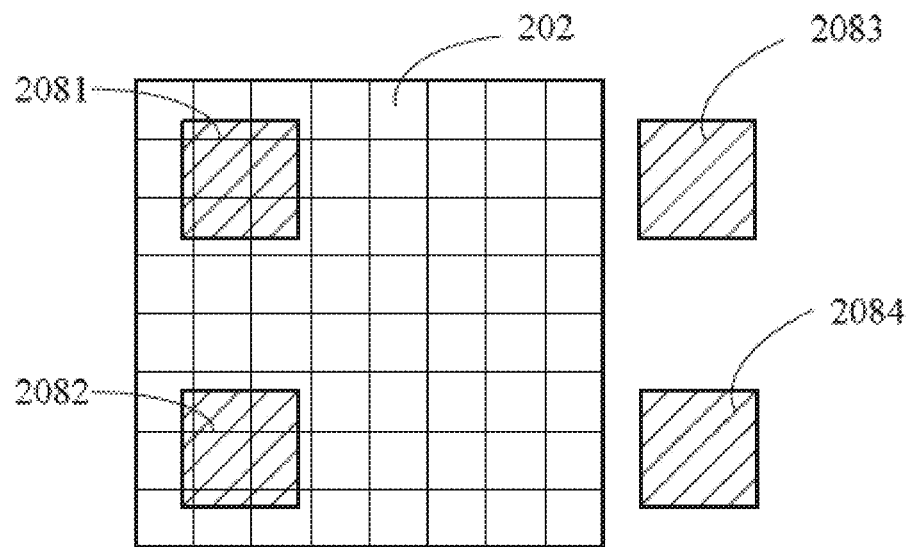

FIG. 6 illustrates an example of the cross section of a PET detector. The PET detector may include a crystal array of 8×8 crystal elements 202 and a semiconductor sensor array of 2×2 semiconductor sensors (e.g., semiconductor sensors 2081, 2082, 2083, and 2084). In some embodiments, one or more of the semiconductor sensors may or may not be coupled to a crystal element 202. A crystal element that is coupled to a given semiconductor sensor is also referred to herein as a crystal element corresponding to the given semiconductor sensor. As an example, semiconductor sensor 2081 and/or semiconductor sensor 2082 may be coupled to one or more crystal elements 202 in the crystal array. As another example, semiconductor sensor 2083 and/or semiconductor sensor 2084 are not coupled to a crystal element 202 in some embodiments.

In another embodiment of the present invention, the semiconductor sensor array covers the light output surface of the crystal array completely or partially, so that the semiconductor sensor may receive photons at the light output surface.

Figure 7:
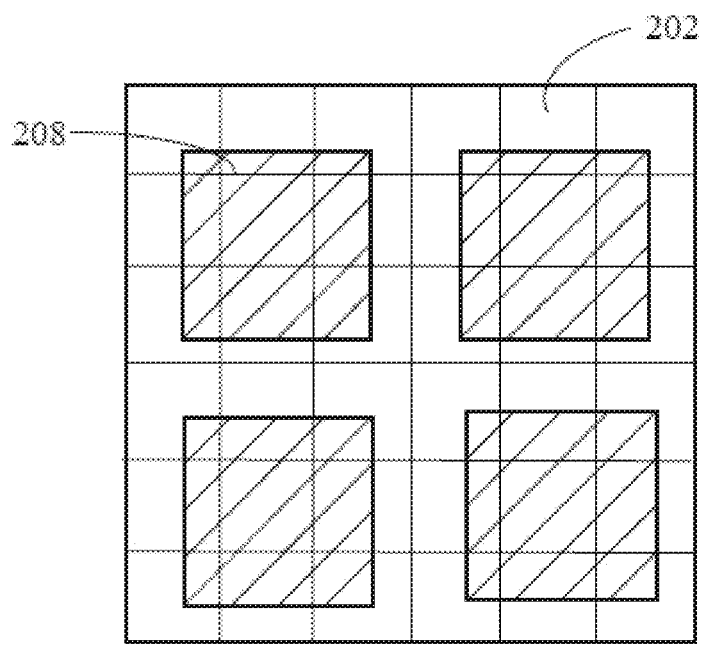

FIG. 7 illustrates an example of the cross section of the PET detector in accordance with some embodiments of the disclosure. In some embodiments in which the semiconductor sensor array covers the light output surface of the crystal array completely, each crystal element 202 in the crystal array may be covered by the semiconductor sensor. As such, each crystal element 202 in the crystal array is coupled to at least one semiconductor sensor 208 in the semiconductor sensor array and thus corresponds to the at least one semiconductor sensor. The corresponding semiconductor sensor may be part of the semiconductor sensors in the array or all of the semiconductor sensors in the array. For example, one or more semiconductor sensors 208 may be coupled with a given crystal element 202 and thus correspond to the given crystal element 202.

In some embodiments in which the semiconductor sensor array partially covers the light output surface of the crystal array, one or more portions of the crystal array (e.g., one or more crystal elements) are coupled to the corresponding semiconductor sensor 208. In an embodiment of the present disclosure, as shown in FIG. 3, each semiconductor sensor 208 in the semiconductor sensor array is coupled with one or more crystal elements 202 in the crystal array. The semiconductor sensor array covers the light output surfaces of part of the crystal elements in the crystal array. In another embodiment, as shown in FIG. 6, a portion of the semiconductor sensor array are coupled to the crystal elements in the crystal array. The portion of the semiconductor sensor array may include one or more semiconductor sensors. The portion of the semiconductor sensor array may cover the light output surfaces of one or more crystal elements in the crystal array.

In order to determine the positions of the photons which are excited by the γ ray inside the crystal elements according to the output of the semiconductor sensors more conveniently, the center-of-gravity of the semiconductor sensor array and the center-of-gravity of the crystal array may be set coincidently. When the center-of-gravity of the semiconductor sensor array and the center-of-gravity of the crystal array coincide, the positions of the photons may be determined using the center-of-gravity readout method. As shown in FIGS. 3-5, the semiconductor sensor array may include multiple semiconductor sensors 208 that are arranged in an array. The crystal array comprises multiple crystal elements 202 that are arranged in an array. As such, the center-of-gravity of the semiconductor sensor array and the center-of-gravity of the crystal array coincide. The center-of-gravity of the crystal array may be determined by a calculation of dimensions of the crystal array based on the center-of-gravity of the semiconductor sensor array. The positions of the photons may then be determined by the center-of-gravity of the crystal array.

In some implementations, the semiconductor sensor array may include three or more semiconductor sensors. The semiconductor sensors may be and/or include silicon photomultipliers (SiPM), photoresistors, photodiodes, phototransistors, and/or any other suitable device that may be used as a semiconductor sensor in accordance with embodiments of the present disclosure. Wherein the resolution of the crystal elements in the image is related to the number and positions of the semiconductor sensors. In some implementations, persons skilled in the art may adjust the number and positions of the semiconductor sensors in the above-mentioned embodiments according to the requirement of the resolution of the crystal elements in the image. For example, as shown in FIGS. 3-5, the semiconductor sensor array may include any suitable number of semiconductor sensors (e.g., four, five, eight, etc. semiconductor sensors) to achieve various resolutions of the crystal elements in images generated by the PET detector.

The resolution of the crystal elements in the image may refer to the resolution of the corresponding position of each crystal element in the image obtained by the PET detector. When the resolution of the crystal elements in the image is higher, the corresponding position of each crystal element is clearer, and the boundaries between different positions of the crystal elements are sharper.

As described above, the PET detector may have any suitable number of semiconductor sensors. The semiconductor sensors may be arranged in various manners. For example, a semiconductor sensor of the PET detector may or may not correspond to a crystal element in the crystal array. As such, embodiments of the present disclosure address the deficiencies of existing PET detectors by providing a PET detector with enhanced resolution and by reducing the number of semiconductor sensors used in the PET detector.

In some embodiments, the PET detector may generate an optical signal and may convert the optical signal into an electrical signal (e.g., using the semiconductor sensors on the base of inner photoelectric effect). Compared with the devices which convert optical signals into electrical signals based on external photoelectric effect, the semiconductor sensors have the advantages of small size, light weight, imperviousness to magnetic fields while working, etc.

For example, the common used diameter dimensions of PMTs which convert optical signals into electrical signals based on external photoelectric effect are ¾ inch, 1 inch and 1.5 inches. And the dimensions of diameter of semiconductor sensors are usually 3×3 mm$^2$ or 6×6 mm$^2$. When contacting the crystal elements, the contact area of a 1-inch PMT is about 8×8 cm$^2$, while that of a 6×6 mm$^2$ semiconductor sensor is about 2×2 cm$^2$. The larger the contact area of the crystal elements is, the more the number of events received in unit time is, which means the detector's dead time becomes longer and the signals would be more likely to pile up, thus the sensitivity of the PET detector gets worse. Calculations show that the number of events received by a 1-inch PMT in unit time is 16 times as much as that by a 6×6 mm$^2$ semiconductor. Under the same circumstance, the dead time of a PET detector with PMT sensors is about 2-3 times as much as that of a PET detector with semiconductor sensors. Therefore, the PET detector with semiconductor sensors has a higher sensitivity. Furthermore, the PET detector with semiconductor sensors as previously described may work free from the influence of magnetic fields, which makes it more convenient for the user.

In some embodiments, the light-splitting structures may be coupled to the surface of the crystal elements in any suitable manner. For example, the light-splitting structures may be coupled to the surfaces of one or more crystal elements that form a portion of the crystal array. As another example, each crystal element 202 may be coupled to one or more light-splitting structures. The position and dimensions of light-splitting structures set on each crystal element may or may not be the same.

Figure 8:
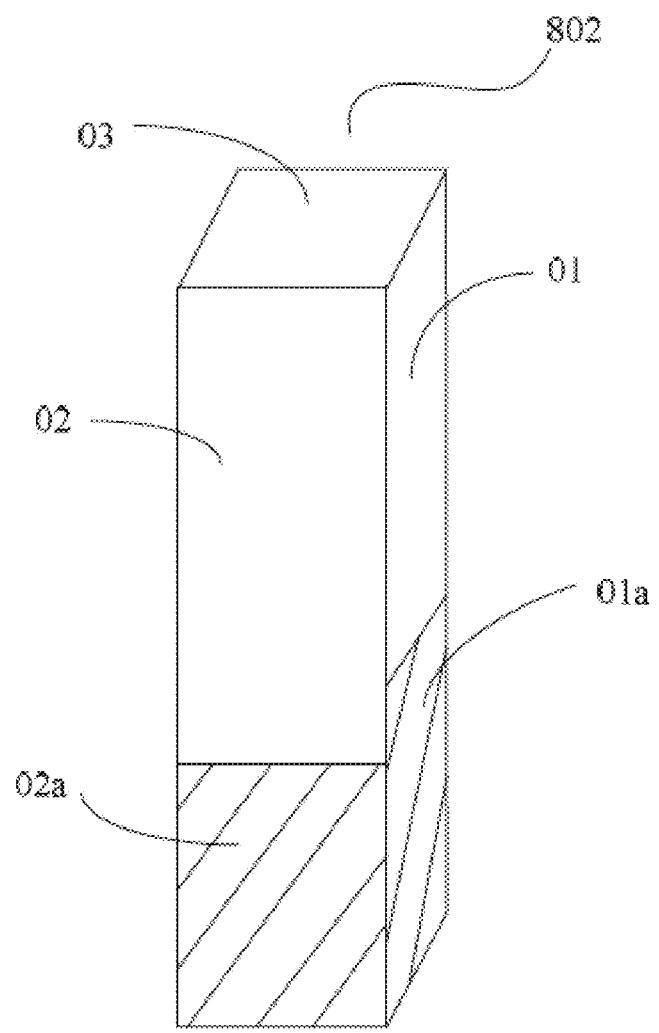
FIG. 8 is a diagram illustrating a light-splitting structure coupled to a crystal element according to some embodiments of the present disclosure.

FIG. 8 illustrates an example 802 of a crystal element in accordance with some embodiments of the disclosure. As shown, crystal element 802 may have multiple surfaces, such as surfaces 01, 02, and 03. One or more light-splitting structures (e.g., light-splitting structures 01a and 02a) may be on one or more surfaces of the crystal element 802. In some embodiments, the area of a light-splitting structure on a surface of crystal element 802 (e.g., surface 03 that defines a light output surface of crystal element 802) may be smaller than the area of the surface of crystal element 802. Crystal element 802 may have a surface 04 opposite to surface 03 (not shown in FIG. 8) that receives a γ ray. A light-splitting structure may be on surface 04. In some embodiments, the light-splitting structure on surface 04 of crystal element 802 may be coextensive with surface 04 of crystal element 802. That is, the area of a light-splitting structure on surface 04 of crystal element 802 may be equal to the area of surface 04 of crystal element 802. The areas of the light-splitting structures on each crystal element may or may not be the same. For example, in some embodiments in which surface 03 may be used to define a light output surface of crystal element 802, light-splitting structures 01a and 02a may be on surface 01 and surface 02, respectively. The area of light-splitting structure 01a may or may not be the same as that of light-splitting structure 02a. In some embodiments, a light-splitting structure on surface 03 (not shown in FIG. 8) may be smaller than surface 03.

Upon receiving a γ ray at the crystal element 802, the γ ray excites multiple photons inside the crystal element 802. In some embodiments, one or more of the photons may enter into a semiconductor sensor corresponding to surface 03 (e.g., a semiconductor sensor coupled to surface 03). One or more of the other photons may enter into one or more other crystal elements of the crystal array through one or more other surfaces of the crystal element 802 (e.g., surface 01, surface, 02, etc.). The other photons may then transmit between the other crystal elements, and may ultimately enter into one or more semiconductor sensors corresponding to the other crystal elements. In some embodiments, the PET detector may determine the position of photon excitation inside the crystal elements based on an output of the semiconductor sensors.

In some embodiments, one or more of the light-splitting structures on crystal element 802 may be and/or include at least one first light-splitting structure and at least one second light-splitting structure. In some embodiments, a reflectivity of the second light-splitting structure is larger than a reflectivity of the first light-splitting structure. The at least one first light-splitting structure may be configured to split a plurality of photons among the plurality of crystal elements of the crystal array. The at least one second light-splitting structure may be configured to prevent a photon from traversing multiple crystal arrays among the plurality of crystal arrays.

In some embodiments, one or more of the light-splitting structures on crystal element 802 may be and/or include the surface of the crystal element 802 (or referred to as a crystal surface), one or more light-reflective films and/or white light-reflective coatings on the surface of crystal element, etc. The crystal surface itself may constitute a first light-splitting structure. The crystal surface itself may be configured to reflect a photon. In some embodiments, the crystal surface itself may be machined to a curvature so that the crystal surface can reflect a photon. In some embodiments, the crystal surface may be machined to a specific roughness. For instance, the crystal surface itself may be machined to a mirror face, i.e. a mirror surface. The mirror face may have a small roughness ($R_a$), e.g., the roughness ($R_a$) of the mirror face being smaller than or equal to 0.008 μm, 0.012 μm, 0.016 μm, 0.025 μm, 0.032 μm, 0.05 μm, 0.063 μm, 0.08 μm, 0.1 μm, 0.2 μm, 0.4 μm, 0.8 μm, and so on. In some embodiments, the at least one first light-splitting structure includes a surface. In some embodiments, the roughness ($R_a$) of the surface is equal to or smaller than 3.2 μm. The light-reflective film(s) and/or white light-reflective coating(s) on the surface of the crystal element 802 may constitute a second light-splitting structure. In some embodiments, the second light-splitting structure (e.g., the light-reflective films and/or white light-reflective coatings) may be mounted on crystal element 802. The surface being equipped with the second light-splitting structure may be a mirror face or a rough face. The roughness ($R_a$) of the rough surface may be greater than 0.8 μm. For example, the roughness ($R_a$) of the rough surface may be equal to or greater than 0.8 μm and smaller than or equal to 5 μm.

The light-splitting structure of a crystal element may be configured depending on where the crystal element is located in the crystal array. For instance, the light-splitting structure of a peripheral crystal element may be configured differently than the light-splitting structure of an internal crystal element. More descriptions regarding a peripheral crystal element, an internal crystal element, and the light-splitting structure thereof may be found elsewhere in the present disclosure. See, e.g., FIG. 20 and the description thereof.

Each of the light-splitting structures may be configured to have a particular size and/or be positioned in a particular portion of a surface of the crystal element. The number of photons that may pass through a given light-splitting structure may be determined based on the size of the given light-splitting structure and the position of the light-splitting structure on the surface. The different photons numbers further lead to the numbers of photons that each semiconductor sensor receives are different, which ultimately affect the analyzed position results of photons according to the output of semiconductor sensor. Taking two crystal elements as an example, various configurations of the light-splitting structures coupled to one of the crystal elements may be used to cause various numbers of photons excited in the crystal element to be entered into the other crystal element.

Figure 9:
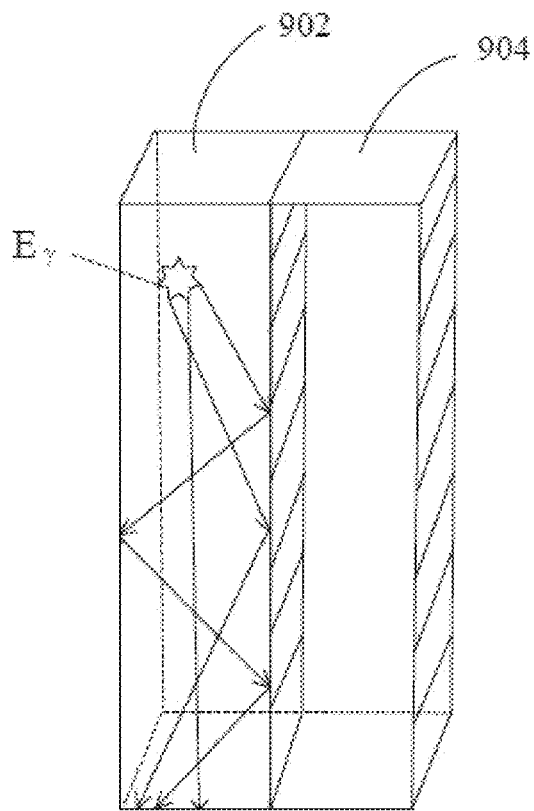
FIG. 9 is a diagram illustrating a transmission path of a photon between two crystal elements according to one embodiment of the present disclosure.
Figure 10:
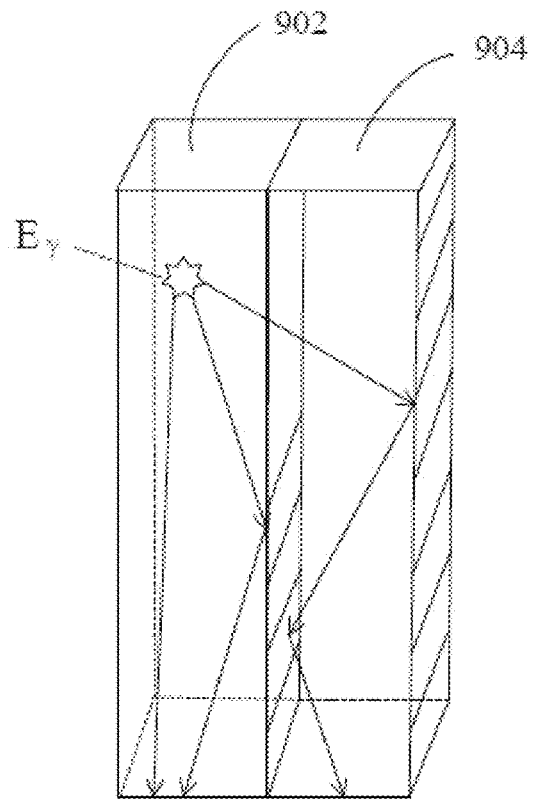
FIG. 10 is a diagram illustrating a transmission path of a photon between two crystal elements according to another embodiment of the present disclosure.

For example, as shown in FIGS. 9 and 10, the PET detector may include crystal elements 902 and 904 that are adjacent to each other. As illustrated using the dash area, a light-splitting structure (e.g., a white light-reflective coating) is on a surface of the crystal element 904 that is adjacent to a surface of crystal element 902. The surface of crystal element 904 is also referred to as the "contact surface" herein. In some embodiments, a γ ray may excite multiple photons (e.g., three photons) in the crystal element 902. When the photons that are excited inside the crystal element 902 transmit to the white light-reflective coating, the photons reflect as an effect of the white light-reflective coating, instead of entering into the crystal element 904 through the white light-reflective coating. In some embodiments, when the photons transmit to a contacting surface which is not part of the white light-reflective coating, the photons may enter into the crystal element 904 through the contacting surface which is not part of the white light-reflective coating.

For example, as shown in FIG. 9, the area of the white light-reflective coating may be equal to or greater than that of the contact surface of crystal element 902. In such an example, neither of the two photons that transmit to the contact surface may enter into the crystal element 904. As another example, as shown in FIG. 10, the white light-reflective coating covers a portion of the contact surface (e.g., about half of the contact surface). In such an example, one of the two photons that transmit to the contact surface may enter into the crystal element 904.

As described above, various configurations of light-splitting structures on surfaces of a particular crystal element may be used to cause various numbers of photons to enter into other crystal elements. To clearly identify each crystal, the area of the light-splitting structure on a crystal element may be adjusted by adjusting the probability that photons appear in a crystal element.

In some embodiments, the probability that photons appear in a selected crystal element in the crystal array may be determined using the following formula:

$$P(m) = \frac{N!}{m!(N-m)!} p^m (1-p)^{(N-m)}, \tag{1}$$

where N represents the total number of photons that are excited inside any crystal element other than the selected crystal element in the crystal array. m represents the number of photons that occur inside the selected crystal element when the total number of photons excited inside any crystal element is N. p represents a probability that when a photon is excited in the arbitrary crystal unit the photon happen to occur in the selected crystal unit. P represents the probability of the number of the photons that occur inside the selected crystal element is m when the total number of photons excited inside any crystal element is N.

The area of a light-splitting structure on a crystal element may be adjusted based on formula (1). In some embodiments, one or more values of N, m, and P may be determined based on tests and/or experiments. An image generated by the PET detect may need to have a certain resolution of crystal elements (e.g., a resolution that is equal to or greater than a threshold) to be used to determine the location in a crystal element where photons are excited, when analyzing the location where photons are excited according to the output of semiconductor sensors. In some embodiments, if more photons appear inside each crystal element in the crystal array, the resolution of each crystal element in the image is higher. When the probability of occurrence of photon inside the selected crystal element P meets the resolution requirement of crystal element in the image, the crystal element will be set according to the area of light-splitting structure corresponding to the probability P.

A light-splitting structure coupled to the selected crystal element may be configured based on the probability that photons would appear in the selected crystal element. In some embodiments, a PET detector may determine that the probability that photons appear in the selected crystal element is higher than a predetermined value (e.g., a probability that is equal to or greater than a threshold) and may configure the light-splitting structure based on the determination. For example, a special machine to assemble PET detectors may reduce the area of the light-splitting structure on the crystal element. As another example, the special machine may adjust the position of the light-splitting structure on the crystal element. As still another example, the special machine may reduce the same time and adjust the position of the light-splitting structure on the crystal element. In some embodiments, the PET detector may determine that the probability that photons appear in the selected crystal element is not high (e.g., a probability that is not greater than a threshold) and may configure the light-splitting structure based on the determination. For example, the special machine may increase the area of the light-splitting structure on the crystal element. As another example, the special machine can adjust the position of the light-splitting structure on the crystal element. As still another example, the special machine may increase the area of light-splitting structure and may adjust the position of light-splitting structure on the crystal element.

In one embodiment of this invention, a 1×10 crystal array is assembled, wherein the crystal array includes 10 crystal elements and light-splitting structures are set on each crystal element. Taking a PET detector comprising the 1×10 crystal array as an example, a detailed illustration is given on the adjusting of light-splitting structures set on each surface of crystal element according to formula (1).

Figure 11:
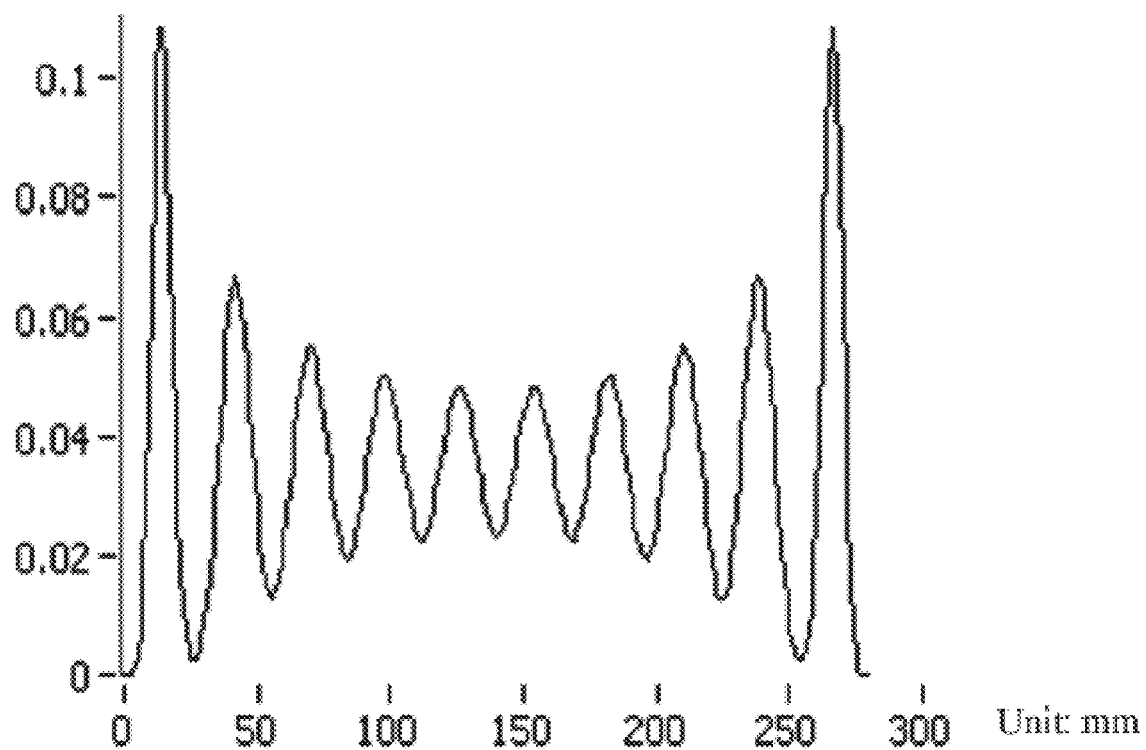
FIG. 11 is a diagram illustrating the probability distribution of photons that appear inside a crystal element in the crystal array before adjusting a diagram illustrating the probability distribution of photons that appear inside a crystal element in the crystal array before adjusting in accordance with some embodiments of the disclosure.
Figure 12:
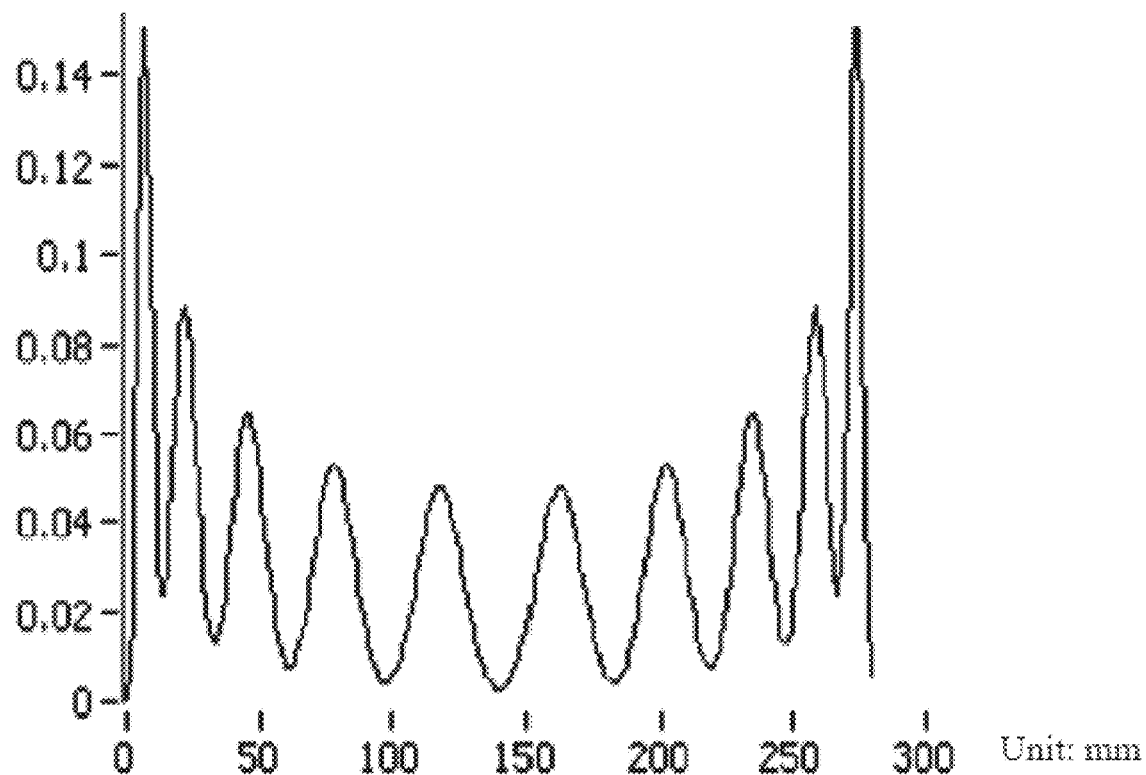
FIG. 12 is a diagram illustrating a distribution of the probability that photons appear in a crystal element of a 1×10 crystal array after adjustment of a PET detector in accordance with some embodiments of the disclosure.

As shown in FIG. 11 and FIG. 12, FIG. 11 illustrates the probability distribution of photons that appear inside a crystal element in the crystal array before adjusting. FIG. 12 illustrates the probability distribution of photons that appear inside a crystal element in the crystal array after adjusting. The horizontal axis in the FIG. 11 and FIG. 12 represents the positioning of each crystal element, in which the waveform between the two adjacent wave troughs represents the probability distribution of photons that occur in different positioning inside one crystal element. The vertical axis represents the probability distribution of photons that appear inside each crystal element. The waveform represents the probability distribution of photons that occur in the crystal element. If the peak-to-trough ratio of a waveform is great, the resolution of crystal element in the image that obtained is high.

By comparing FIG. 11 to FIG. 12, it is suggested that most values of peak-to-trough ratio of the waveforms that represent the probability distribution of photons that appear in the crystal element in FIG. 12 are higher than the corresponding ones in FIG. 11. That is to say, a PET detector with a higher resolution may be obtained by adjusting the light-splitting structures set on the surface of a crystal element according to formula (1).

In a specific embodiment, to better satisfy the resolution requirements of crystal element on images, when setting the light-splitting structures on the surfaces of crystal elements, light-receiving areas of the semiconductor sensors, relative positioning among semiconductor sensors, and relative positioning between semiconductor sensors and the crystal array may also be used to set the light-splitting structures on the crystal elements. That is to say, settings of the light-splitting structures on the surfaces of crystal elements may also need to match light-receiving areas of the semiconductor sensors, relative positioning among semiconductor sensors, and relative positioning between semiconductor sensors and the crystal array.

Wherein, the light-receiving areas of the semiconductor sensors may already be determined when the semiconductor sensors are dispatched from the manufacturer. For example, a conventional semiconductor sensor may have a light-receiving area of 3×3 mm² or 6×6 mm². In practice, in order to further minimize the size of the PET detector, semiconductor sensors with light-receiving areas of 3×3 mm² may be chosen.

Under common conditions, among the factors of light-receiving areas of the semiconductor sensors, relative positioning among semiconductor sensors, relative positioning between semiconductor sensors and the crystal array, and the probability of photons occurring in each crystal elements, when one or more of the mentioned factors are determined, the PET detector may satisfy the resolution requirements of crystal element on images by adjusting other parameters of the factors.

For example, when the light-receiving areas of the semiconductor sensors are determined, relative positioning among semiconductor sensors, relative positioning between semiconductor sensors and the crystal array, and the probability of occurrence of photon in each crystal element may be adjusted to satisfy the resolution requirements of crystal element on images. When the light-receiving areas of the semiconductor sensors, and the probability of photons occurring in each crystal elements are determined, relative positioning among semiconductor sensors, and relative positioning between semiconductor sensors and the crystal array may be adjusted to satisfy the resolution requirements of crystal element on images. When the light-receiving areas of the semiconductor sensors, relative positioning among semiconductor sensors, and relative positioning between semiconductor sensors and the crystal array are determined, the probability of occurrence of photon in each crystal element may be adjusted to satisfy the resolution requirements of crystal element on images.

Therefore, when setting the PET detector in embodiments of the present invention, the areas of light-splitting structures on each crystal elements of the crystal array may be adjusted first, and followed by the semiconductor sensor array being set according to the light output surfaces of the crystal. Alternatively, the semiconductor sensor array may be set according to the light output surfaces of the crystal first, followed by adjusting the areas of light-splitting structures on each crystal elements of the crystal array. Regardless of the order of the two, it suffices to satisfy the resolution requirements of crystal element on images.

When the PET detector is being used to detect the location where photons are excited, as described above, one crystal element in the crystal array receives a γ ray, and the γ ray excites photons in the crystal element. After the semiconductor sensors have received the photons from the light output surface of the crystal array, the locations where the photons are excited by the γ rays in the crystal elements may be determined according to the output of the semiconductor sensors. In some embodiments, the PET detector may further include a chip configured to determine the output of the semiconductor sensors. The input terminal of the chip may be operably connected with the output terminals of each semiconductor sensor of the semiconductor sensor array. The chip may determine a time signal and an energy signal of each semiconductor sensor of the semiconductor sensor array. The chip may determine the locations where the photons are excited by the γ rays in the crystal elements according to the energy signal.

In some embodiments, when determining the locations where the photons are excited based on the output of the semiconductor sensors and using the center-of-gravity readout method, the total energy of excited photons (E), the energy of photons received by semiconductors in one row (X1), and one of the columns of the energy of photons received by semiconductors (Y1) need to be calculated. By such calculation, the row location of the excited photons may be x=X1/E, and the column location may be y=Y1/E. The location where the photons are excited may be determined by the values of x and y. Wherein, the total energy (E) of all the excited photons may be equal to the sum of the energies detected by each semiconductor sensors of the PET detector. One of the rows of the energy of photons received by semiconductors (X1) may be equal to the sum of the energies detected by each semiconductor sensors in one of the rows. One of the columns of the energy of photons received by semiconductors (Y1) may be equal to the sum of the energies detected by each semiconductor sensors in one of the columns.

Currently, when determining the location where photons are excited, the common procedure is: reading the output data from each semiconductor sensors, and determining the location of photons according to the readings of data. In other words, when using the above mentioned procedure, the amount of data read and the number of semiconductor sensors are the same. In such a way, when the PET detector includes multiple semiconductor sensors, the amount of data processed to determine the location where photons are excited is increased, and therefore, the difficulty to determine the location where photons are excited is also increased. For example, when using a PET detector as shown in FIG. 5 to determine the location where photons are excited, since the PET detector includes 8 semiconductor sensors, the number of sets of data totals 8 after reading the data from the semiconductor sensors. In further processing to determine the location where photons are excited, the 8 sets of data need to be processed to determine the location where photons are excited, and the difficulty of determining the location where photons are excited may be increased.

As a solution to the above mentioned situation, in an embodiment of the present invention, when setting the PET detector, the PET detector may further include a first amplifier, and the input terminal of the first amplifier may be connected with the output terminal of a predetermined row of semiconductor sensors in the semiconductor sensor array. Wherein, number of the first amplifier may be set according to the row number of the semiconductor sensor array, and number of the first amplifier may be equal to or less than the row number of the semiconductor sensor array. When connecting the input terminal of the first amplifier with the output terminal of a predetermined row of semiconductor sensors in the semiconductor sensor array, each input terminal of the first amplifier are connected with each output terminal of a predetermined row of semiconductor sensors in the semiconductor sensor array correspondingly, and each input data of the first amplifier is also an output terminal of a predetermined row of semiconductor sensors in the semiconductor sensor array. In such a way, when using center-of-gravity readout method to determine the location where photons are excited, the output of a row of semiconductor sensors may be determined directly according to the output of the first amplifier, and it is not required to read output of every semiconductor sensor. The amount of data processed to determine the location where photons are excited, and the difficulty to determine the location of photons may be both reduced.

In the same manner, when setting the PET detector, the PET detector may further include a second amplifier, and the input terminal of the second amplifier may be connected with the output terminal of a predetermined column of semiconductor sensors in the semiconductor sensor array. For detailed descriptions regarding setting the second amplifier, reference should be made to the descriptions regarding the first amplifier, which will not be repeated here.

In practice, the PET detector may only include either the first amplifier or the second amplifier, or include both the first amplifier and the second amplifier. When the PET detector includes both the first amplifier and the second amplifier, the amount of data processed when the location where photons are excited is determined may be further reduced to determine the location where photons are excited, as well as the difficulty to determine the location of photons.

Figure 13:
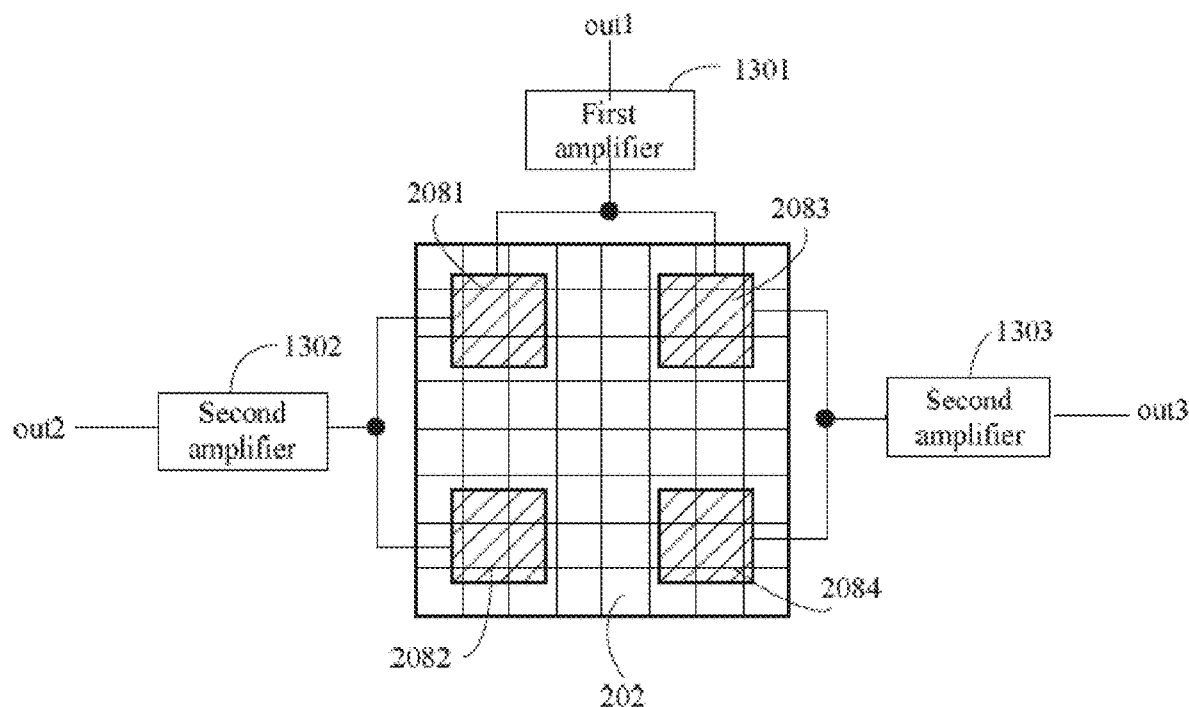
FIG. 13 is a structural diagram illustrating a cross section of a PET detector according to some embodiments of the present disclosure.

Taking the PET detector shown in FIG. 13 as an example, an illustration of the setting and detecting of the PET detector according to embodiments of the present invention is given.

As shown in FIG. 13, the PET detector include crystal elements 202, which are arranged in an 8×8 crystal array, and semiconductor sensors 2081-2084, which are arranged in a 2×2 semiconductor sensor array.

When setting the PET detector, after specific semiconductor sensors are selected, the relative positioning among semiconductor sensors 2081-2084, and the relative positioning between semiconductor sensors and the crystal array may first be determined, then the light-splitting structures on the surfaces of crystal elements may be further adjusted, to satisfy the resolution requirements of crystal element on images acquired by the PET detector.

Figure 14:
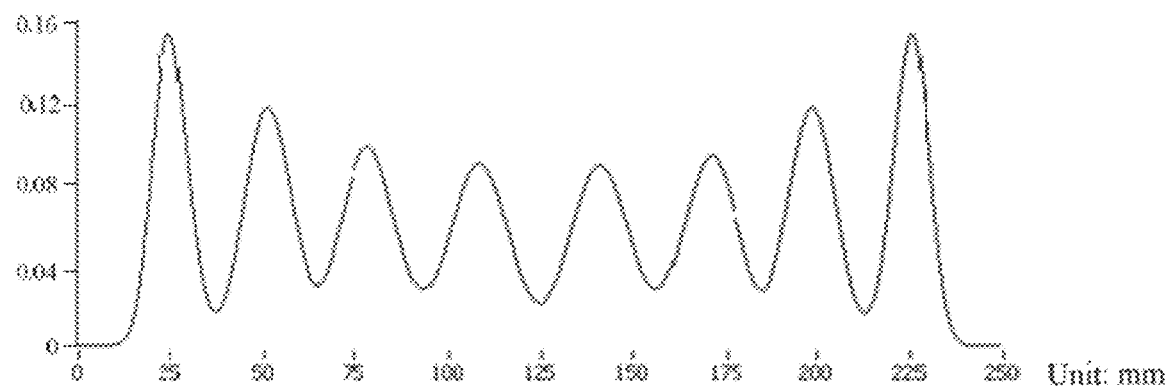
FIG. 14 is a diagram illustrating a distribution of the probability that photons appear in each crystal element of the PET detector in FIG. 13.

Wherein, when adjusting the areas of the light-splitting structures set on the surface of each crystal element 202, the adjustment may be the area of the light-splitting structures corresponding to a probability, wherein the probability meets the resolution condition of crystal elements in the image when adjusting the probability of the photon occurrence inside each crystal element 202. For example, it is possible to make the probability distribution of the photon occurrence inside each crystal element 202 reach the probability distribution shown in FIG. 14. After adjusting the areas of the light-splitting structures set on the surface of each crystal element, set the semiconductor sensor array opposite to the light output surface of the crystal array, the PET detector may be obtained.

In order to subsequently determine the position of photon generation according to the output of the semiconductor sensors more conveniently, it is also possible to set a first amplifier and a second amplifier in the obtained PET detector. When setting the first amplifier, it is possible to set in the row where the semiconductor sensors 2081, 2083 reside, or to set in the row where the semiconductor sensors 2082, 2084 reside, or to set in the row where the semiconductor sensors 2081, 2083 reside and in the row where the semiconductor sensors 2082, 2084 reside at the same time. In some embodiments of the present invention, for example, set the first amplifier 1301 in the row where the semiconductor sensors 2081, 2083 reside. Likewise, when setting the second amplifier, it is possible to set in the column where the semiconductor sensors 2081, 2082 reside, or to set in the column where the semiconductor sensors 2083, 2084 reside, or to set in the column where the semiconductor sensors 2081, 2082 reside and in the column where the semiconductor sensors 2083, 2084 reside at the same time. In some embodiments of the invention, for example, set the second amplifier 1302 in the column where the semiconductor sensors 2081, 2082 reside, and set the second amplifier 1303 in the column where the semiconductor sensors 2083, 2084 reside at the same time.

Wherein, the output of the first amplifier 1301 is out1, and the output of the second amplifier 1302 is out2, and the output of the second amplifier 1303 is out3. Thus, the total energy of photons E=out2+out3, wherein the received photons energy by one row of the semiconductor sensors X1=out1, and the received photons energy by one column of the semiconductor sensors Y1=out2 or Y1=out3. It is important to note that, after determining the one row and the one column, the position of photon generation may be determined in the coordinates wherein the one row is X-axis and the one column is Y-axis. For example, assume the received photon energy Y1=out2 by the one column of the semiconductor sensors, according to the center-of-gravity readout method, the row of the position of photon generation x=X1/E=out1/(out2+out3), y=Y1/E=out2/(out2+out3). Thus, the position of photon generation may be determined according to the outputs of the first amplifier 1301, the second amplifier 1302, and the third amplifier 1303. In comparison to determining the position of photon generation by the outputs of semiconductor sensors 2081, 2082, 2083 and 2084, it effectively reduces the amount of data processing when determining the position of photon generation.

Figure 15:
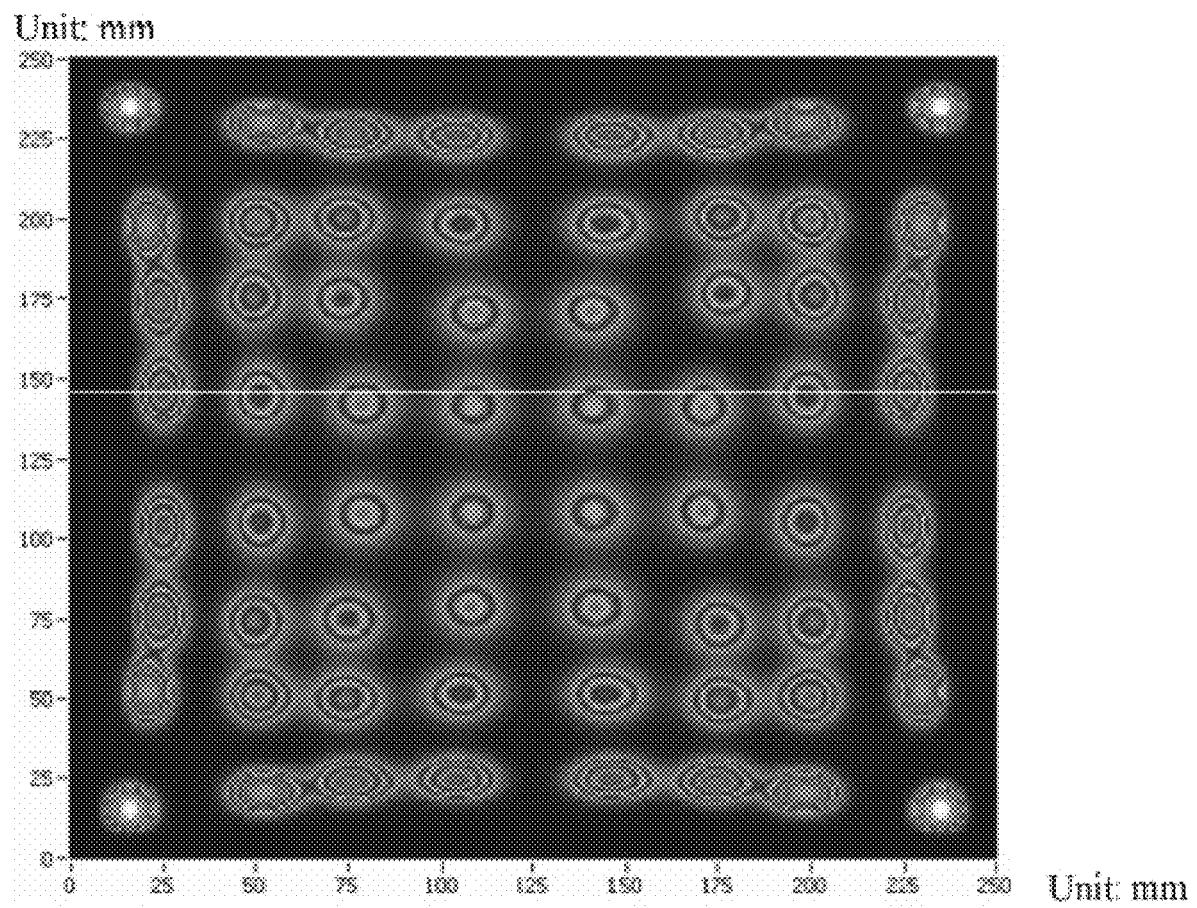
FIG. 15 is a two-dimension image of each crystal element location generated by the PET detector in FIG. 13.

By detection simulation by the PET detector, the obtained two-dimensional image analytic results regarding the position of each crystal element is shown in FIG. 15, wherein the horizontal ordinate represents the position of the columns where each crystal element resides and the vertical ordinate represents the position of the rows where each crystal element resides. It is shown by FIG. 15 that each crystal element is arranged evenly, and each crystal element is clearly visible, such that the resolution of the crystal elements in the figure is relatively high. The photon positions may be obtained precisely by applying the PET detector to detect the position of photon generation.

To help those skilled in the art understand and practice the embodiments of the present invention, the methods corresponding to the PET detector will be illustrated below.

Figure 16:
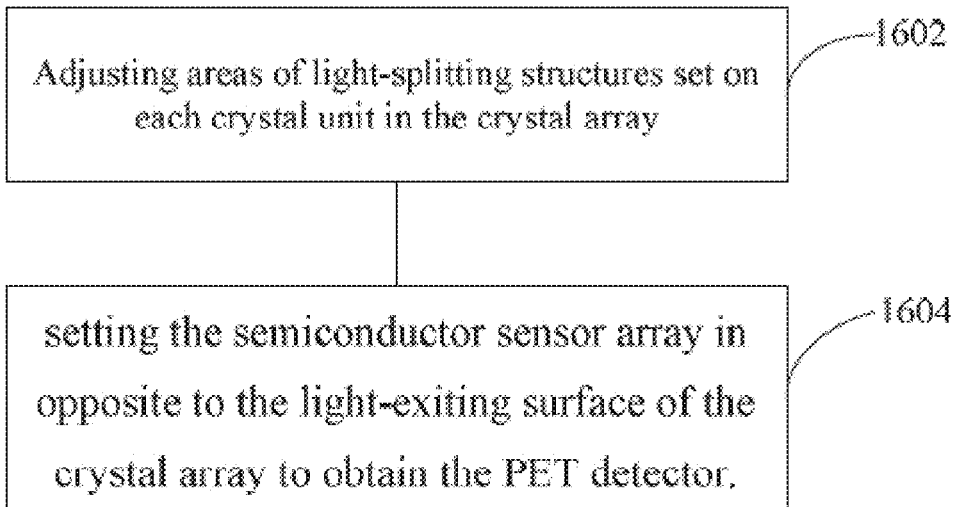
FIG. 16 is a flow chart illustrating a method for configuring a PET detector according to one embodiment of the present invention.

As shown in FIG. 16, some embodiments of the present invention also provides a method for setting up PET detector, the method may comprise:

Step 1602: adjusting areas of light-splitting structures set on each crystal element in the crystal array.

wherein, when adjusting areas of light-splitting structures set on each crystal element in the crystal array, adjusting the probability of occurrence of photon in the each crystal element, when the probability of occurrence of photon in the each crystal element fulfills a resolution condition of the crystal elements in an image, set the crystal elements according to the area of the light-splitting structure corresponding to the probability of occurrence of photon.

When adjusting the probability of occurrence of photon in the each crystal element, adjusting the probability of occurrence of photon in a selected crystal element according to the equation (1).

Step 1604: setting the semiconductor sensor array in opposite to the light output surface of the crystal array, to obtain the PET detector.

It should be noted that, in specific embodiments of the present invention, the execution order of Step 1602 and Step 1604 is not limited. That is to say, it is possible to adjust the areas of light-splitting structures set on each crystal element in the crystal array first, then set the semiconductor sensor array in opposite to the light output surface of the crystal array, or set the semiconductor sensor array in opposite to the light output surface of the crystal array first, then adjust the areas of light-splitting structures set on each crystal element in the crystal array; the above description is not limiting.

When applying the setting method in the embodiments of the present invention to set up the PET detector, one may refer to the description of embodiments of PET detectors illustrated above, and further discussion will not be provided here.

Figure 17:
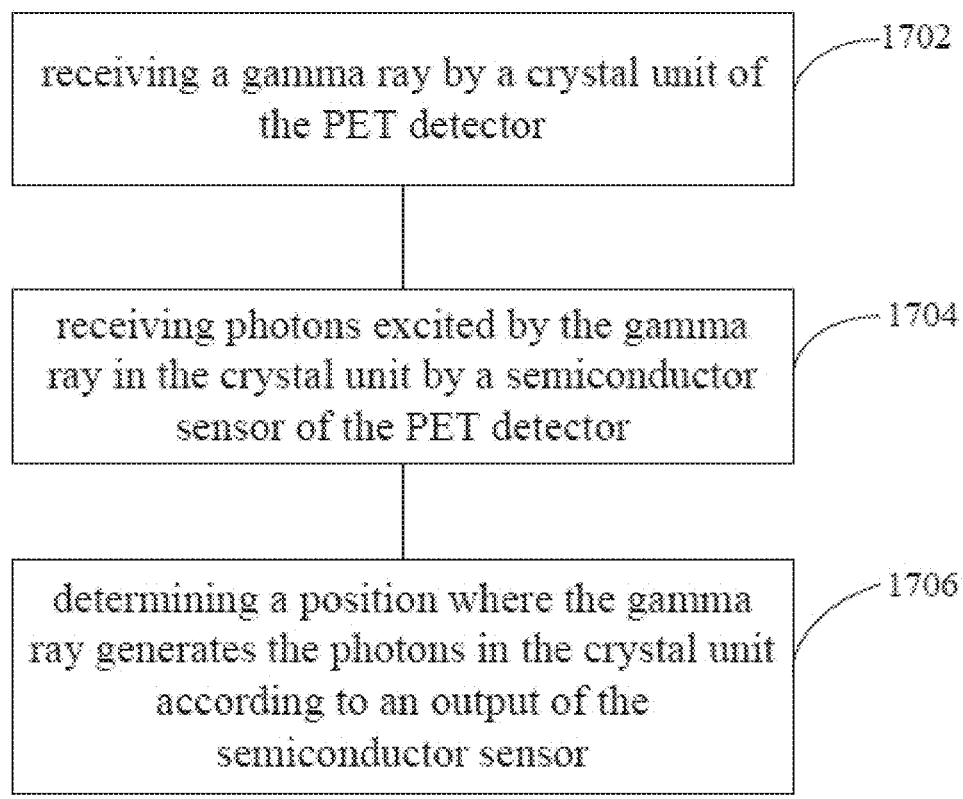
FIG. 17 is a flow chart illustrating a method for providing a PET detector according to one embodiment of the present invention.

As shown in FIG. 17, embodiments of the present invention also provide a method for detecting with PET detector, the method may comprise:

Step 1702: receiving a gamma ray by a crystal element of the PET detector.

Step 1704: receiving photons excited by the gamma ray in the crystal element by a semiconductor sensor of the PET detector;

Among them, Step 1702 and Step 1704 may be executed referring to the description of embodiments of PET detectors illustrated above.

Step 1706: determining a position where the gamma ray generates the photons in the crystal element according to an output of the semiconductor sensor.

In practice, the location where photons are excited inside the crystal elements by the gamma ray may be determined by the center-of-gravity readout method, referring to the description of embodiments of PET detector illustrated above.

Although the present invention is disclosed as above, the present invention is not limited thereto. Any skilled in the art, without departing from the spirit and scope of the present invention, may come up with various changes and modifications, and therefore the scope of protection regarding the present invention should be defined by the claims.

Figure 18:
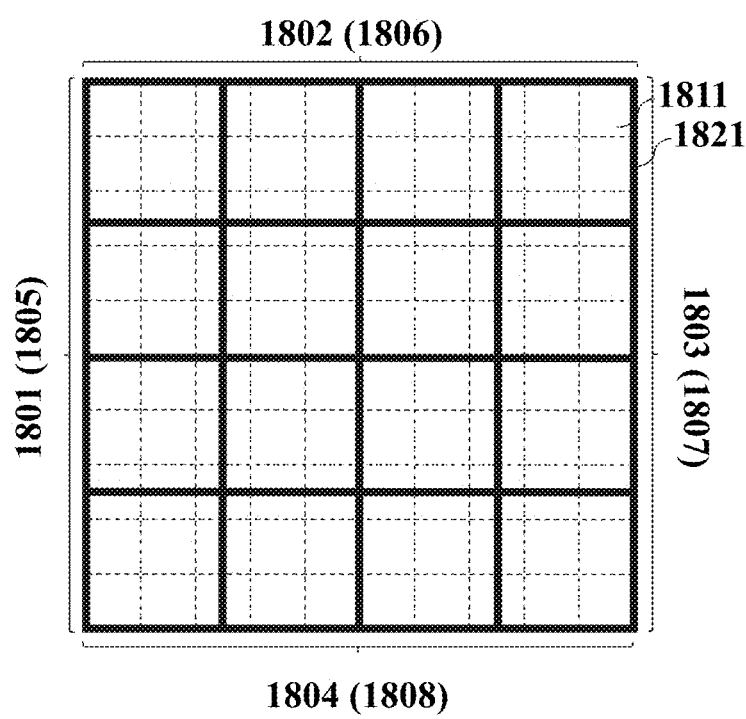
FIG. 18 is a diagram illustrating a cross section of an example PET detector according to some embodiments of the present disclosure.

FIG. 18 is a diagram illustrating a cross section of an example PET detector according to some embodiments of the present disclosure. The PET detector may include a crystal array and a semiconductor sensor array. The crystal array may include a plurality of crystal elements (e.g., dashed squares in FIG. 18) arranged in a single layer. The semiconductor sensor array may include a plurality of semiconductor sensors (e.g., squares shown by solid lines in FIG. 18) for receiving photons excited by gamma rays from the plurality of crystal elements. The semiconductor sensor array may be operably connected to a driver board (e.g., as shown in FIG. 2). It is understood that the shape of square of the crystal elements and of the semiconductor sensors in FIG. 18 is for illustration purposes and not intended to be limiting. A crystal element or a semiconductor sensor may be of a shape other than a square.

Figure 19:
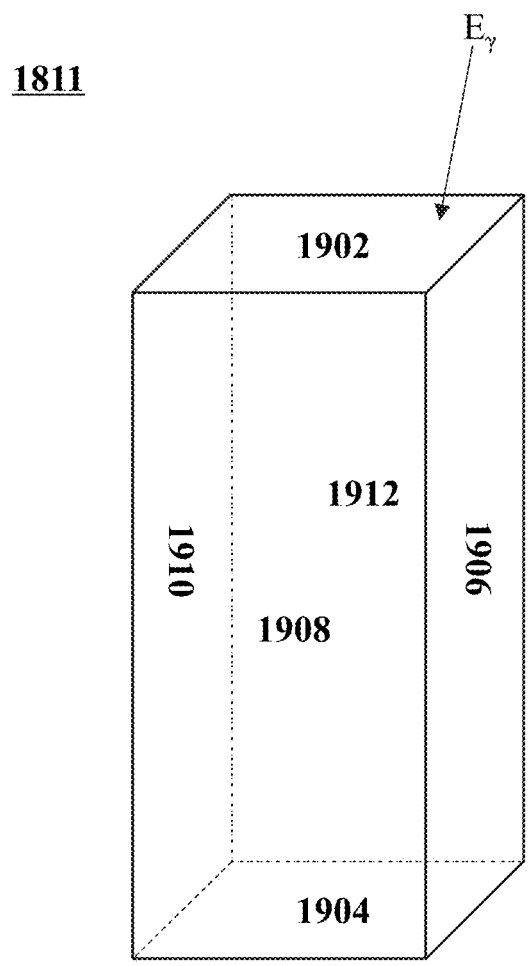
FIG. 19 is a diagram illustrating an example crystal element according to some embodiments of the present disclosure.

In some embodiments, a crystal element (e.g., crystal element 1811 in FIG. 18) of the plurality of crystal elements of the crystal array may include a first surface (e.g., surface 1902 in FIG. 19) that gamma rays enter into, a second surface (e.g., surface 1904 in FIG. 19) opposite to the first surface, and a side surface (e.g., the sum of surfaces 1906, 1908, 1910, and 1912 in FIG. 19) between the first surface and the second surface.

In some embodiments, the crystal array may include one or more peripheral crystal elements. At least a portion of the side surface of a peripheral crystal element does not face at least one crystal elements of the crystal array.

Figure 20:
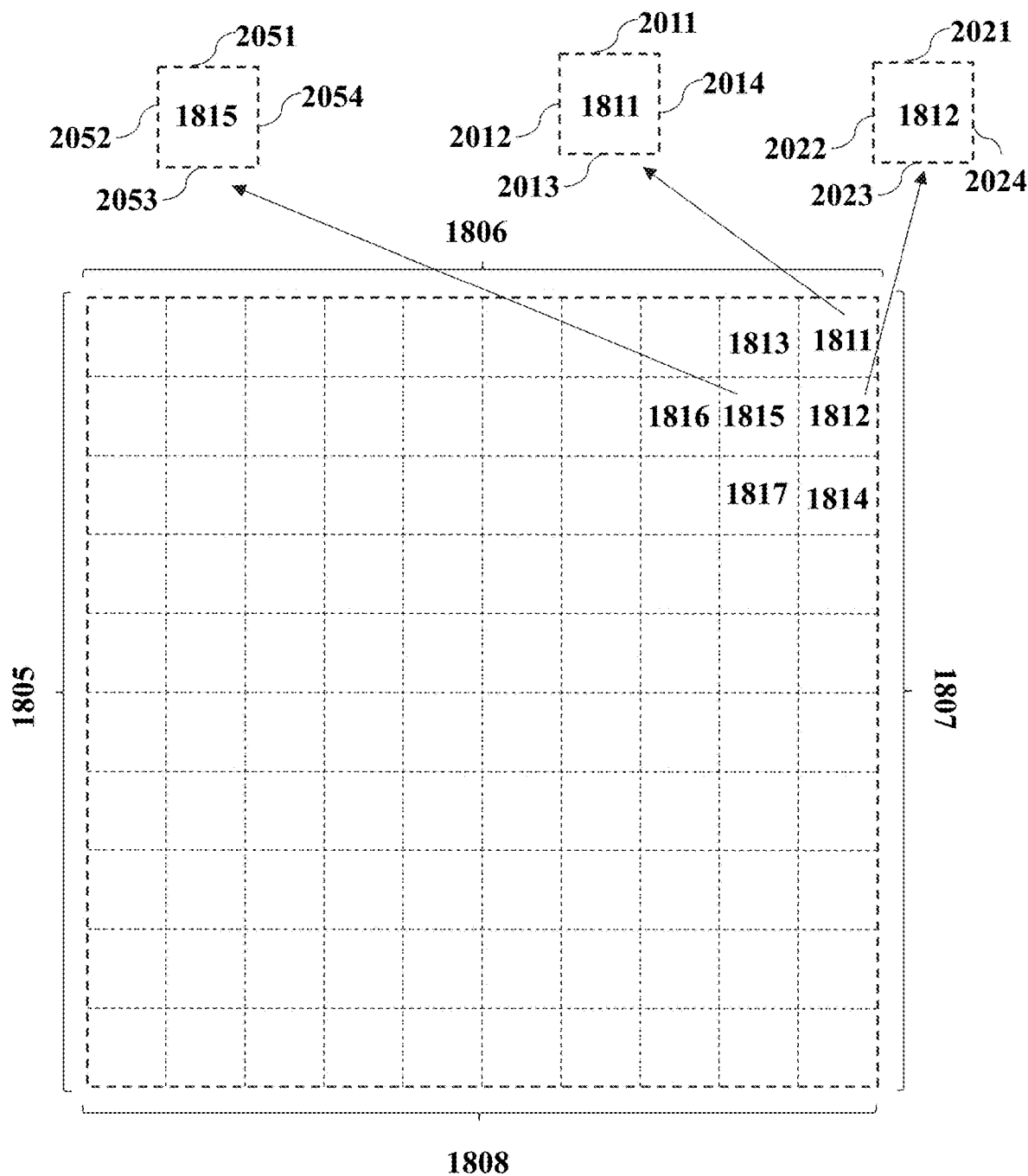
FIG. 20 is a diagram illustrating a cross section of an example crystal array of a PET detector according to some embodiments of the present disclosure.

Merely by way of example, as shown in FIG. 20, crystal element 1811 may be a peripheral crystal element of the crystal array. Crystal element 1811 may include a side surface including surfaces 2011, 2012, 2013, and 2014. At least a portion of the side surface of crystal element 1811 (e.g., surfaces 2011 and 2014) does not face at least one crystal element of the crystal array. Surface 2012 may face crystal element 1813 of the crystal array, and surface 2013 may face crystal element 1812 of the crystal array. In some embodiments, a light-splitting structure (e.g., a light-reflective film and/or white light-reflective coating) may be mounted on surfaces 2011 and 2014 of crystal element 1811. In some embodiments, surfaces 2011 and 2014 may each include a mirror face configured to mirror reflect photons impinging thereon. In some embodiments, surfaces 2012 and/or 2013 themselves may function as a light-splitting structure of surfaces 2012 and 2013 of crystal element 1811. Surfaces 2012 and/or 2013 may include a mirror face or have a curvature that can reflect a photon.

As another example, as shown in FIG. 20, crystal element 1812 may be a peripheral crystal element of the crystal array. Crystal element 1812 may include a side surface including surfaces 2021, 2022, 2023, and 2024. At least a portion of the side surface of crystal element 1812 (e.g., surface 2024) does not face at least one crystal element of the crystal array. Surface 2021 may face crystal element 1811 of the crystal array, surface 2023 may face crystal element 1814 of the crystal array, and surface 2022 may face crystal element 1815 of the crystal array. In some embodiments, a light-splitting structure (e.g., a light-reflective film and/or white light-reflective coating) may be mounted on surface 2024 of crystal element 1812. In some embodiments, surface 2024 may be configured as a mirror face that mirror reflect photons impinging thereon. In some embodiments, surfaces 2021, 2022, and/or 2023 themselves may be served as a light-splitting structure of surfaces 2021, 2022, and/or 2023 of crystal element 1812. Surfaces 2021, 2022, and/or 2023 may include a mirror face or a curvature that can reflect a photon.

In some embodiments, the crystal array may also include one or more internal crystal elements. The entire side surface of an internal crystal element may face at least one of the crystal elements of the crystal array. In some embodiments, at least a part of one or more surfaces of the entire side surface of the internal crystal element may function as a light-splitting structure of the one or more surfaces of the internal crystal element or may be equipped with a light-splitting structure including, e.g., a light-reflective film, a white light-reflective coating, or the like, or a combination thereof. In some embodiments, the part of the surface that is equipped with the light-reflective film and/or white light-reflective coating may be a rough face or a mirror face. In some embodiments, there may be a gap between two adjacent crystal elements of the crystal array. The gap may be filled with air. The one or more surfaces of the entire side surface of the internal crystal element that contacts the air may mirror reflect photons.

For example, as shown in FIG. 20, crystal element 1815 may be an internal crystal element of the crystal array. Crystal element 1815 may include a side surface including surfaces 2051, 2052, 2053, and 2054, each of which faces a crystal element (e.g., crystal element 1812, 1813, 1817, or 1816) of the crystal array. Surface 2051 faces crystal element 1813, surface 2052 faces crystal element 1816, surface 2053 faces crystal element 1817, and surface 2054 faces crystal element 1812. At least a part of one or more surfaces of surfaces 2051, 2052, 2053, and 2054 of crystal element 1815 may function as a light-splitting structure of the one or more surfaces of crystal element 1815 or may be equipped with a light-splitting structure including, e.g., a light-reflective film, a white light-reflective coating, or the like, or a combination thereof. In some embodiments, the part of the surface that is equipped with the light-reflective film and/or white light-reflective coating may be a rough face or a mirror face.

In some embodiments, the crystal array may have an outer side surface (e.g., the sum of surfaces 1805, 1806, 1807, and 1808 in FIG. 18 and/or FIG. 20) defined by at least a portion of the side surfaces of the peripheral crystal elements. In some embodiments, a light-splitting structure (e.g., a light-reflective film and/or white light-reflective coating) may be mounted on the outer side surface of the crystal array. In some embodiments, the outer side surface of the crystal array may be configured as a mirror face to mirror reflect photons impinging thereon. The at least a portion of the side surfaces of the peripheral crystal elements that belongs to the outer side surface of the crystal array does not face at least one crystal element of the crystal array. For example, outer side surface 1806 of the crystal array may include surface 2011 of crystal element 1811. Outer side surface 1807 of the crystal array may include surface 2014 of crystal element 1811 and surface 2024 of crystal element 1812. The crystal array may have a γ ray entry surface where a γ ray enters the crystal array. In some embodiments, a light-splitting structure (e.g., a light-reflective film and/or white light-reflective coating) may be mounted on the γ ray entry surface. In some embodiments, the γ ray entry surface may be configured as a mirror face or a rough face. The γ ray entry surface may include surface 1902 of crystal element 1811. In some embodiments, the crystal array may have the light output surface that is opposite to the γ ray entry surface. The light output surface may include surface 1904 of crystal element 1811. In some embodiments, the semiconductor sensor array may cover a first part of the light output surface of the crystal array, and a light-splitting structure (e.g., a light-reflective film and/or white light-reflective coating) may cover a second portion of the light output surface of the crystal array. In some embodiments, the second portion of the light output surface of the crystal array may be configured as a mirror face or a rough face. In some embodiments, the semiconductor sensor array may cover the light output surface of the crystal array entirely.

In some embodiments, the crystal array may have a plurality of inner surfaces. Each of the plurality of inner surfaces may include a side surface of one of the plurality of crystal elements that faces a side surface of another one of the plurality of crystal elements. For example, the plurality of inner surfaces may include surfaces 2012 and 2013 of crystal element 1811, surfaces 2021, 2022, and/or 2023 of crystal element 1812, and surfaces 2051, 2052, 2053, and 2054 of crystal element 1815 as illustrated in FIG. 20.

In some embodiments, at least a portion of each of one or more of the plurality of inner surfaces of the crystal array may be configured as a first light-splitting structure, i.e. a mirror face. In some embodiments, the size of the crystal array may be large, for example, an array of 6×6, 8×8, 20×20, and so on, crystal elements. In some embodiments, in such a crystal array, the roughness of the mirror face of an inner surface may be so high that the mirror face can split photons in the crystal array. For example, the roughness of the mirror face may be 0.2 µm, 0.3 µm, 0.4 µm, 0.5 µm, 0.6 µm, 0.7 µm, and so on. In some embodiments, in such a crystal array, a first portion of an inner surface of the crystal array may include a first light spitting structure and a second portion of the inner surface of the crystal array may not include a first light spitting structure. The second portion of the inner surface of the crystal array may include one or more rough faces to split photons in the crystal array. The roughness of the rough face(s) may be equal to or greater than 0.8 µm and smaller than or equal to 5 µm. In some embodiments, the size of the crystal array may be small, for example, an array of 2×2, 3×3, etc., crystal elements; at least a portion of each of one or more of the inner surface(s) of the crystal array may be configured as a mirror face to reflect photons in the crystal array.

In some embodiments, at least a portion of each of one or more of the plurality of inner surfaces of the crystal array may be equipped with the second light-splitting structure, i.e. a light-reflective film and/or white light-reflective coating. In some embodiments, the size of the crystal array may be large, for example, an array of 6×6, 8×8, 20×20, and so on, crystal elements. In such a crystal array, a portion of the inner surface(s) that is/are not equipped with the second light-splitting structure(s) may be rough face(s) to split photons in the crystal array. The roughness of the rough face(s) may be equal to or greater than 0.8 µm and smaller than or equal to 5 µm. In some embodiments, the size of the crystal array may be small, for example, an array of 2×2, 3×3, and so on, crystal elements. In such a crystal array, a portion of the inner surface(s) that is/are not equipped with the second light-splitting structure(s) may be configured as rough face(s) or mirror face(s).

In some embodiments, each of the plurality of semiconductor sensors of the semiconductor sensor array may include a light-receiving surface for receiving, from the second surfaces of the plurality of crystal elements, photons excited by the gamma rays impinging on the plurality of crystal elements. The light-receiving surfaces of the plurality of semiconductor sensors may face the second surfaces of the plurality of crystal elements. The second surfaces of the plurality of crystal elements may be in contact with the light-receiving surfaces of the plurality of semiconductor sensors directly or through an adhesive material. In some embodiments, each of the plurality of semiconductor sensors of the semiconductor sensor array may further include a contact surface that is opposite to the light-receiving surface and is in contact with a driver board directly (e.g., as shown in FIG. 2). In some embodiments, the contact surface of the semiconductor sensor may have an edge. For example, as shown in FIG. 21, the contact surface of semiconductor sensor 1821 may have an edge including lines 2111, 2112, 2113, and 2114.

In some embodiments, the semiconductor sensor array may include one or more peripheral semiconductor sensors. At least a portion of the edge of the contact surface of a peripheral semiconductor sensor does not face at least one semiconductor sensor of the semiconductor sensor array.

Figure 21:
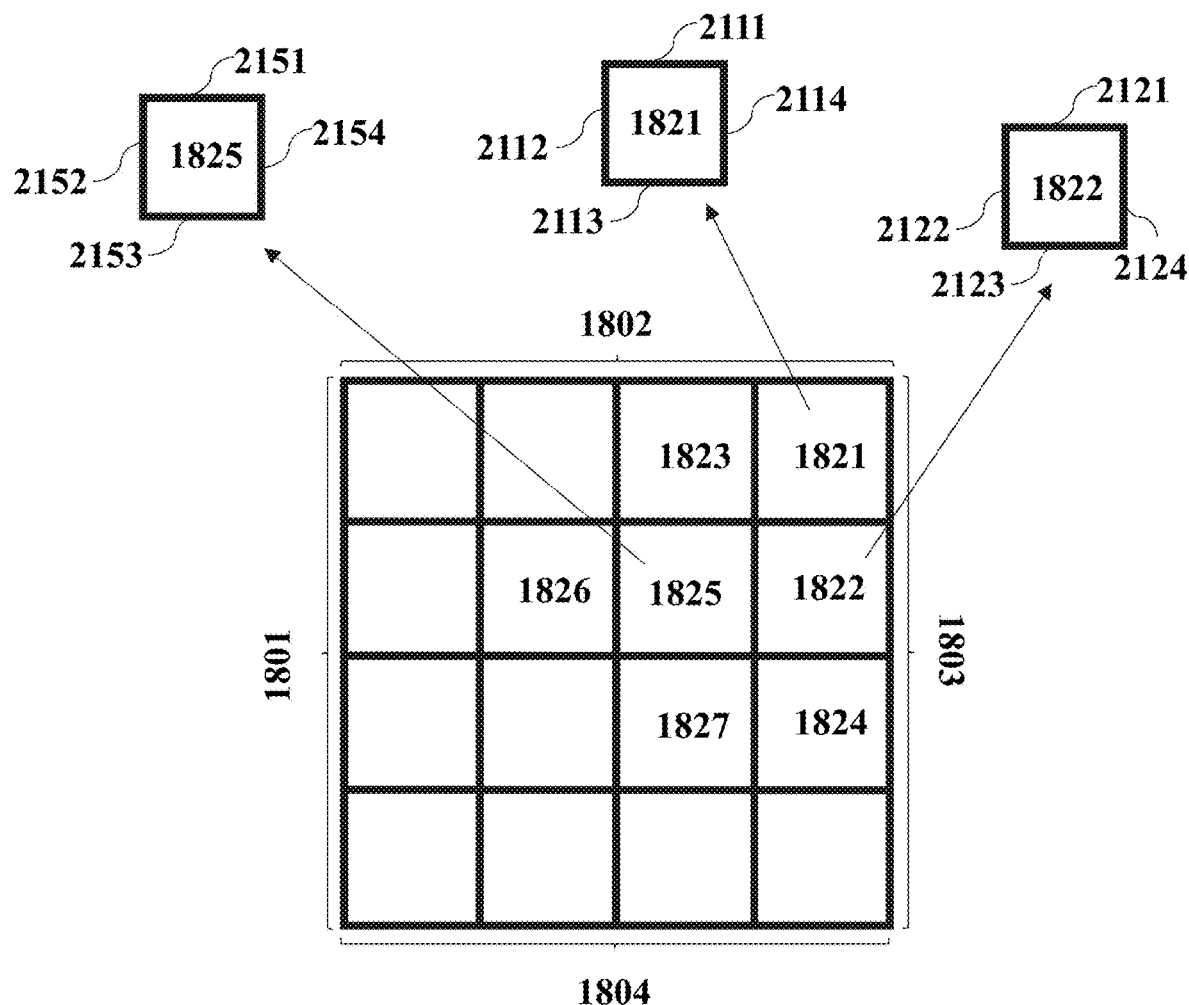
FIG. 21 is a diagram illustrating contact surfaces of a plurality of semiconductor sensors of an example semiconductor sensor array of a PET detector according to some embodiments of the present disclosure.

Merely by way of example, as shown in FIG. 21, semiconductor sensor 1821 may be a peripheral semiconductor sensor of the semiconductor sensor array. The contact surface of semiconductor sensor 1821 may include an edge including lines 2111, 2112, 2113, and 2114. At least a portion (e.g., lines 2111 and 2114) of the edge does not face at least one semiconductor sensor of the semiconductor sensor array. Line 2112 may face semiconductor sensor 1823 of the semiconductor array, and line 2113 may face semiconductor sensor 1822 of the semiconductor array.

As another example, as shown in FIG. 21, semiconductor sensor 1822 may be a peripheral semiconductor sensor of the semiconductor sensor array. The contact surface of semiconductor sensor 1822 may include an edge including lines 2121, 2122, 2123, and 2124. At least a portion (e.g., line 2124) of the edge does not face at least one semiconductor sensor of the semiconductor sensor array. Line 2121 may face semiconductor sensor 1821 of the semiconductor array, line 2123 may face semiconductor sensor 1824 of the semiconductor array, and line 2122 may face semiconductor sensor 1825 of the semiconductor array.

In some embodiments, the semiconductor sensor array may also include one or more internal semiconductor sensors. The entire edge of the contact surface of an internal semiconductor sensor may face at least one of the plurality of semiconductor sensors.

For example, as shown in FIG. 21, semiconductor sensor 1825 may be an internal semiconductor sensor of the semiconductor sensor array. The edge of the contact surface of semiconductor sensor 1825 may include lines 2151, 2152, 2153, and 2154, each of which faces a semiconductor sensor (e.g., semiconductor sensor 1822, 1823, 1827, or 1826) of the semiconductor sensor array. Line 2151 may face semiconductor sensor 1823, line 2152 may face semiconductor sensor 1826, line 2153 may face semiconductor sensor 1827, and line 2154 may face semiconductor sensor 1822.

In some embodiments, the semiconductor sensor array may have an edge (e.g., the sum of lines 1801, 1802, 1803, and 1804 in FIG. 18 and/or FIG. 21) defined by at least a portion of the edges of the contact surfaces of the peripheral semiconductor sensors. The at least a portion of the edges that belongs to the edge of the semiconductor array does not face at least one semiconductor sensor of the semiconductor sensor array. For example, line 1802 of the edge of the semiconductor sensor array may include line 2111 of the edge of semiconductor sensor 1821. Line 1803 of the edge of the semiconductor sensor array may include line 2114 of the edge of semiconductor sensor 1821 and line 2124 of the edge of semiconductor sensor 1822.

In some embodiments, the number (or count) of the plurality of crystal elements may be more than or equal to the number (or count) of the plurality of semiconductor sensors. In some embodiments, the semiconductor sensor array may be (substantially) coextensive with the crystal array. In some embodiments, at least a portion of an area of the driver board or a region surrounded by the edge (e.g., the sum of lines 1801, 1802, 1803, and 1804) of the semiconductor sensor array may completely cover the second surfaces of the plurality of crystal elements. In some embodiments, at least a portion of an area of the driver board surrounded by the edge (e.g., the sum of lines 1801, 1802, 1803, and 1804) of the semiconductor sensor array may be (substantially) coextensive with the second surfaces of the plurality of crystal elements. For example, the edge of the semiconductor sensor array may be aligned with the outer side surface of the crystal array along a direction vertical to the first surface.

In some embodiments, the plurality of semiconductor sensors may have a same size (e.g., as shown in FIG. 18 and/or FIG. 21) or different sizes.

What is claimed is:

1. A positron emission tomography (PET) detector, comprising:
   a crystal array comprising a plurality of crystal elements and a plurality of light-splitting structures, the plurality of light-splitting structures including at least one first light-splitting structure and at least one second light-splitting structure, types of the at least one first light-splitting structure and the at least one second light-splitting structure being different, wherein the at least one first light-splitting structure includes a surface, the roughness of which is equal to or smaller than 3.2 um; and
   a semiconductor sensor array comprising a plurality of semiconductor sensors for receiving photons from the crystal array.

2. The PET detector according to claim 1, wherein the plurality of semiconductor sensors include a plurality of silicon photomultipliers (SiPM).

3. The PET detector according to claim 1, wherein the at least one first light-splitting structure includes a mirror face.

4. The PET detector according to claim 1, wherein a reflectivity of the second light-splitting structure is larger than a reflectivity of the first light-splitting structure.

5. The PET detector according to claim 1, wherein the at least one second light-splitting structure includes a light-reflective membrane or a light-reflective coating.

6. The PET detector according to claim 1, wherein the crystal array includes an outer side surface where at least one second light-splitting structure is mounted.

7. The PET detector according to claim 1, wherein the crystal array includes a gamma-ray entry outer surface where at least one second light-splitting structure is mounted.

8. The PET detector according to claim 7, wherein the crystal array includes a light output surface that is opposite to the gamma-ray entry outer surface, and
   the semiconductor sensor array covers the light output surface of the crystal array entirely; or
   the semiconductor sensor array covers a first portion of the light output surface of the crystal array, and the at least one second light-splitting structure covers a second portion of the light output surface of the crystal array.

9. The PET detector according to claim 1, wherein
the crystal array includes a plurality of inner surfaces, and the plurality of inner surfaces are configured with the at least one first light-splitting structure.

10. The PET detector according to claim 9, wherein
two first light-splitting structures on two of the inner surfaces of a crystal element, respectively, have different lengths; or
two first light-splitting structures on two of the inner surfaces of a crystal element, respectively, have a same length.

11. The PET detector according to claim 9, wherein
the first light-splitting structures on two inner surfaces of two of the plurality of crystal elements, respectively, have different lengths; or
the first light-splitting structures on two inner surfaces of two of the plurality of crystal elements, respectively, have a same length.

12. The PET detector according to claim 1, wherein more than one of the plurality of crystal elements in the crystal array are operably coupled with each of at least one semiconductor sensor of the semiconductor sensor array.

13. The PET detector according to claim 1, wherein the plurality of crystal elements are in contact with the plurality of semiconductor sensors directly or through an adhesive material.

14. The PET detector according to claim 1, further including a chip configured to determine the output of the semiconductor sensors, wherein an input terminal of the chip is operably connected with an output terminal of each semiconductor sensor of the semiconductor sensor array.

15. The PET detector according to claim 1, wherein a center-of-gravity of the semiconductor sensor array coincides with a center-of-gravity of the crystal array.

16. A positron emission tomography (PET) detector, comprising:
a plurality of crystal arrays, each of the plurality of crystal arrays comprising a plurality of crystal elements and a plurality of light-splitting structures, the plurality of light-splitting structures including at least one first light-splitting structure and at least one second light-splitting structure, wherein
the at least one first light-splitting structure is configured to split a plurality of photons among the plurality of crystal elements of the crystal array, the at least one first light-splitting structure includes a surface, and the roughness of which is equal to or smaller than 3.2 um, and
the at least one second light-splitting structure is configured to prevent a photon from travering multiple crystal arrays among the plurality of crystal arrays; and
a plurality of semiconductor sensor arrays, each of the plurality of semiconductor sensor arrays comprising a plurality of semiconductor sensors for receiving photons from the crystal array.

17. The PET detector according to claim 16, wherein the at least one first light-splitting structure includes a mirror face.

18. The PET detector according to claim 16, wherein the at least one second light-splitting structure includes a light-reflective membrane or a light-reflective coating.

19. The PET detector according to claim 16, wherein the plurality of semiconductor sensors include a plurality of silicon photomultipliers (SiPM).

20. The PET detector according to claim 1, wherein the roughness of the surface of the at least one first light-splitting structure is equal to or smaller than 0.8 μm.

* * * * *